(12) United States Patent
Yang et al.

(10) Patent No.: US 9,657,757 B2
(45) Date of Patent: May 23, 2017

(54) SYSTEM OF EXHUAST AND OPERATION METHOD THEREOF

(71) Applicant: TAIWAN SEMICONDUCTOR MANUFACTURING COMPANY LTD., Hsinchu (TW)

(72) Inventors: Tung-Lin Yang, Hsinchu (TW); Chun-Hung Chang, Hsinchu County (TW); Rouh Jier Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 247 days.

(21) Appl. No.: 14/658,576

(22) Filed: Mar. 16, 2015

(65) Prior Publication Data

US 2016/0273541 A1    Sep. 22, 2016

(51) Int. Cl.
  *F15D 1/00* (2006.01)
  *F04D 25/00* (2006.01)
  *F04D 29/00* (2006.01)

(52) U.S. Cl.
  CPC ............... *F15D 1/00* (2013.01); *F04D 25/00* (2013.01); *F04D 29/00* (2013.01)

(58) Field of Classification Search
  CPC ............. F15D 1/00; F04D 25/00; F04D 29/00
  See application file for complete search history.

(56) References Cited

U.S. PATENT DOCUMENTS

| | | | | |
|---|---|---|---|---|
| 4,344,479 A | * | 8/1982 | Bailey | F22B 7/00 122/155.2 |
| 7,950,214 B2 | * | 5/2011 | Bronicki et al. | F01K 23/10 417/251 |
| 2008/0193330 A1 | * | 8/2008 | Hotta et al. | H01J 37/3244 422/23 |

* cited by examiner

*Primary Examiner* — Kevin Lee
(74) *Attorney, Agent, or Firm* — WPAT, P.C., Intellectual Property Attorneys; Anthony King

(57) ABSTRACT

Some embodiments of the present disclosure provide a method of dissipating process exhaust from a chamber. The method includes conveying the process exhaust from the chamber through an inner tube of a pipeline to abatement. The process exhaust has a first temperature while exiting the chamber, and a second temperature while exiting the pipeline. The method maintains an outer tube of the pipeline at a vacuum state by a pump such that the inner tube is substantially thermal isolated from the atmosphere outside the pipeline. The second temperature is negative offset from the first temperature within a predetermined value.

20 Claims, 27 Drawing Sheets

SYSTEM OF EXHUAST AND OPERATION METHOD THEREOF

FIELD

The present disclosure relates to a method of dissipating process exhaust.

BACKGROUND

In an operation of a manufacturing process, various types of materials are exhausted out of a process chamber. In different field of manufacturing, different types of materials are expelled out to environment through pipelines.

To keep the manufacturing process running, the pipeline is under a certain condition. The condition of the pipeline is dependent on different types of exhaust and the environment of the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
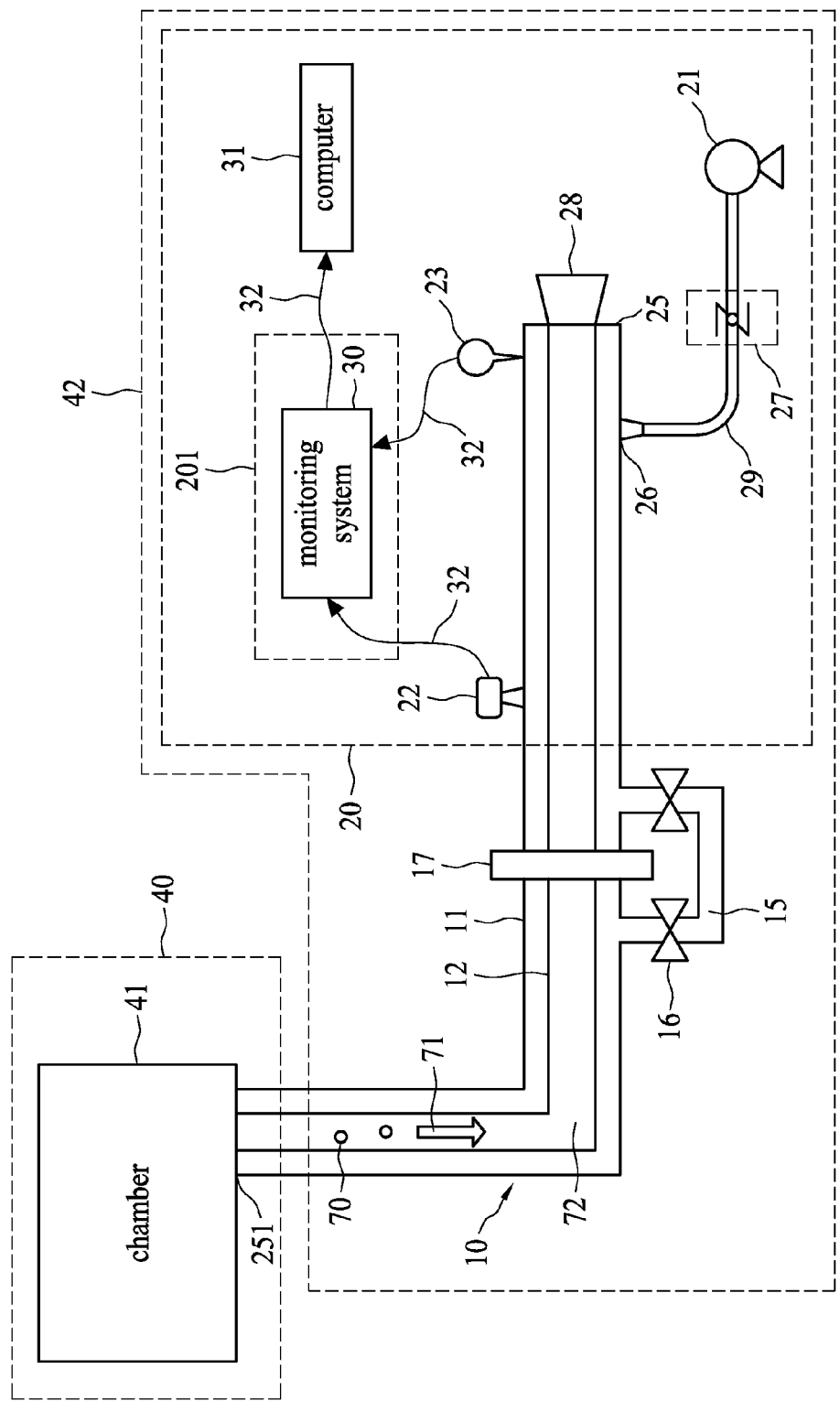
FIG. 1 is a schematic diagram of a system for exhaust dissipation, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In FIG. 1, a chamber 41 is in a main-fabrication environment 40. In some embodiments, the chamber 41 is a process chamber for manufacturing process. The manufacturing process is operating in various types of condition. Different types of conditions include different temperature environment or different pressure environment.

In some embodiments, the manufacturing process includes deposition process such as chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof.

In some embodiments, the manufacturing process includes etching process such as dry etching, wet etching, and/or other etching methods (e.g., reactive ion etching). The etching process is either purely chemical (plasma etching), purely physical (ion milling), and/or combinations thereof.

In FIG. 1, exhaust dissipating system 42 is illustrated. The exhaust dissipating system 42 includes a pipeline 10 configured to connect to an exhaust outlet 251 of chamber 41 at one end. In some embodiments, the exhaust dissipating system 42 is a sub-fabrication environment. The pipeline 10 includes a multi-layer structure. The pipeline 10 includes an inner portion configured for some exhausts 70 to pass through. The inner portion includes inner tube 12 and space enclosed by inner tube 12. In some embodiments, the exhausts 70 are materials expelled from chamber 41. An outer portion surrounded the inner portion and configured to provide a thermal insulation for the inner portion. The outer portion includes outer tube 11 and space between inner tube 12 and outer tube 11. Exhaust dissipating system 42 includes a pump 21 coupled to the outer portion and configured to maintain a vacuum state inside the outer portion.

During the manufacturing process, different types of exhaust 70 are dissipated out from chamber 41 through a pipeline 10. Pipeline 10 conveys the exhausts 70 in a transporting direction 71 from the main-fabrication environment 40 to exhaust dissipating system 42. In some embodiments, the main-fabrication environment 40 and the exhaust dissipating system 42 are distanced from each other at a different level of floor. The exhaust 70 expelled out are different for different types of manufacturing process. The exhausts 70 are in a form of gas, liquid, plasma, solid, and/or combinations thereof. In some embodiments, the chamber 41 is kept in a certain condition such as in a low pressure or a vacuum condition. A pump 28 is coupled at a terminal 25 of the pipeline 10 to decrease pressure in the chamber 41.

The exhausts 70 coming out from chamber 41 includes certain temperature or pressure. In some embodiments, exhaust 70 is in a gaseous form and includes high temperature.

The pipeline 10 includes a double tube. The pipeline 10 is a double layer pipeline 10. The pipeline 10 is configured to meet a certain pressure rating or temperature rating for the outer tube 11 or the inner tube 12. The pipeline 10 is disposed between the chamber 41 and the pump 28. In some embodiments, the pump 28 is a vacuum pump. The double tube includes an inner tube 12 and an outer tube 11. The inner tube 12 is configured for the exhaust 70 to pass through. In some embodiments, the inner tube 12 is made of any suitable material such as stainless steel. The outer tube 11 is configured to provide a thermal insulation for the inner tube 12. To provide a thermal insulation, the pipeline 10 is configured into at least two different portions. Different portions are enclosed by different layers or different tubes. Pipeline 10 includes the inner portion, provided as a path 72 of a process exhaust 70 and an outer portion maintained at a vacuum condition. To prevent a heat loss from inner tube 12 to outer tube 11 through convection, the outer tube 11 is kept in a low pressure condition. In some embodiments, the low pressure condition in the outer tube 11 is in a range of pressure from $10^{-2}$ torr to $10^{-3}$ torr, or from $10^{-3}$ torr to $10^{-4}$ torr, or from $10^{-4}$ torr to $10^{-5}$ torr, or from $10^{-5}$ torr to $10^{-6}$ torr, or from $10^{-6}$ torr to $10^{-7}$ torr. By lowering the pressure in the outer tube 11, heat is kept within the inner tube 12. In some embodiments, the outer tube 11 is made of any suitable material such as stainless steel.

By keeping heat inside inner tube 12, temperature of exhausts 70 is sustained such that a phase transition of exhausts 70 is effectively decreased. The phase transition of exhausts 70 includes from gas phase to liquid phase, gas phase to solid phase, or liquid phase to solid phase. By effectively decreasing the phase transition such as condensation of exhausts 70, particles or dust caused by the phase transition is effectively reduced.

To lower the pressure inside the outer tube 11, a vacuuming system 20 is provided with the pipeline 10. Pump 21 is coupled to the outer tube 11. The pump 21 is configured to decrease the pressure inside the outer tube 11. In some embodiments, the pump 21 is a vacuum pump configured to extract air out of the outer tube 11. The pump 21 is coupled to the outer tube 11 at an opening 26. The pump 21 is coupled to the outer tube 11 through a passage tube 29.

In some embodiments, a valve 27 is coupled to the passage tube 29 between the opening 26 and the pump 21. The valve 27 is coupled to outer tube 11 through the passage tube 29. In some embodiments, the valve 27 is an invert valve configured to prevent a direction of flow from atmosphere toward the outer portion. The valve 27 is configured to keep the direction of air flow in the passage tube 29 in one direction, from the opening 26 toward the pump 21.

A gauge 22 is configured to measure the pressure inside the outer tube 11. The gauge 22 is a pressure gauge. In some embodiments, the gauge 22 is disposed at the outer tube 11. The gauge 22 is coupled to a monitoring system 30. In some embodiment, the gauge 22 is coupled to a monitoring system 30 through signal line 32. A computer 31 is coupled to the monitoring system 30 through signal line 32. In some embodiments, computer 31 is coupled to the gauge 22 through signal line 32. The computer 31 is configured to receive pressure signal from the gauge 22 through the signal line 32. In some embodiments, the signal line 32 is a wire or a cable. The computer 31 is used to receive a pressure signal from the gauge 22.

A temperature sensing device 23 is configured to sense a temperature in the outer tube 11. The temperature sensing device 23 is any suitable device such as a thermometer, a thermocouple, or a thermistor. In some embodiments, the temperature sensing device 23 is used to measure the temperature in the outer tube 11 and to transmit a temperature signal to the computer 31. Temperature sensing device 23 is configured to transmit the temperature signal to the monitoring system 30. The monitoring system 30 is configured to receive the temperature signal from the gauge 22 and transmitting the temperature signal to the computer 31. In some embodiments, the temperature sensing device 23 or the gauge 22 is located near the terminal 25 of the pipeline 10.

In some embodiments, a hub 201 is configured to include the monitoring system 30. The monitoring system 30 is configured to receive multiple types of signal and transmit multiple types of signal. In some embodiments, the hub 201 includes monitoring system 30 to monitor the pressure inside the outer tube 11 online.

A flange 17 is in different sections of the pipeline 10. In some embodiments, the flange 17 is between two segments of the double tube. In some embodiments, the flange 17 is a vacuum flange. In some embodiments, the vacuum flange is disposed at a terminal 25 of a tube used to connect the pipeline 10 with the pump 28. In some other embodiments, the flange 17 is configured to connect chamber 41 with the pipeline 10. The flange 17 is configured to withstand a certain pressure range or temperature range for the outer tube 11 or the inner tube 12. The flange 17 is configured to hinder conduction of heat from the inner tube 12 to the outer tube 11.

An intermediate tube 15 is configured to connect the different sections of the outer tube 11 together. The intermediate tube 15 is coupled to the outer tube 11 at a valve 16. The intermediate tube 15 is configured to keep a pressure inside a section of the outer tube 11 the same with a neighboring section of the outer tube 11. The valve 16 is configured to open or close a passage of air from one section of outer tube 11 to another section of the outer tube 11. The valve 16 is configured to adjust a flow rate of air between each sections of the outer tube 11.

Figure 2:
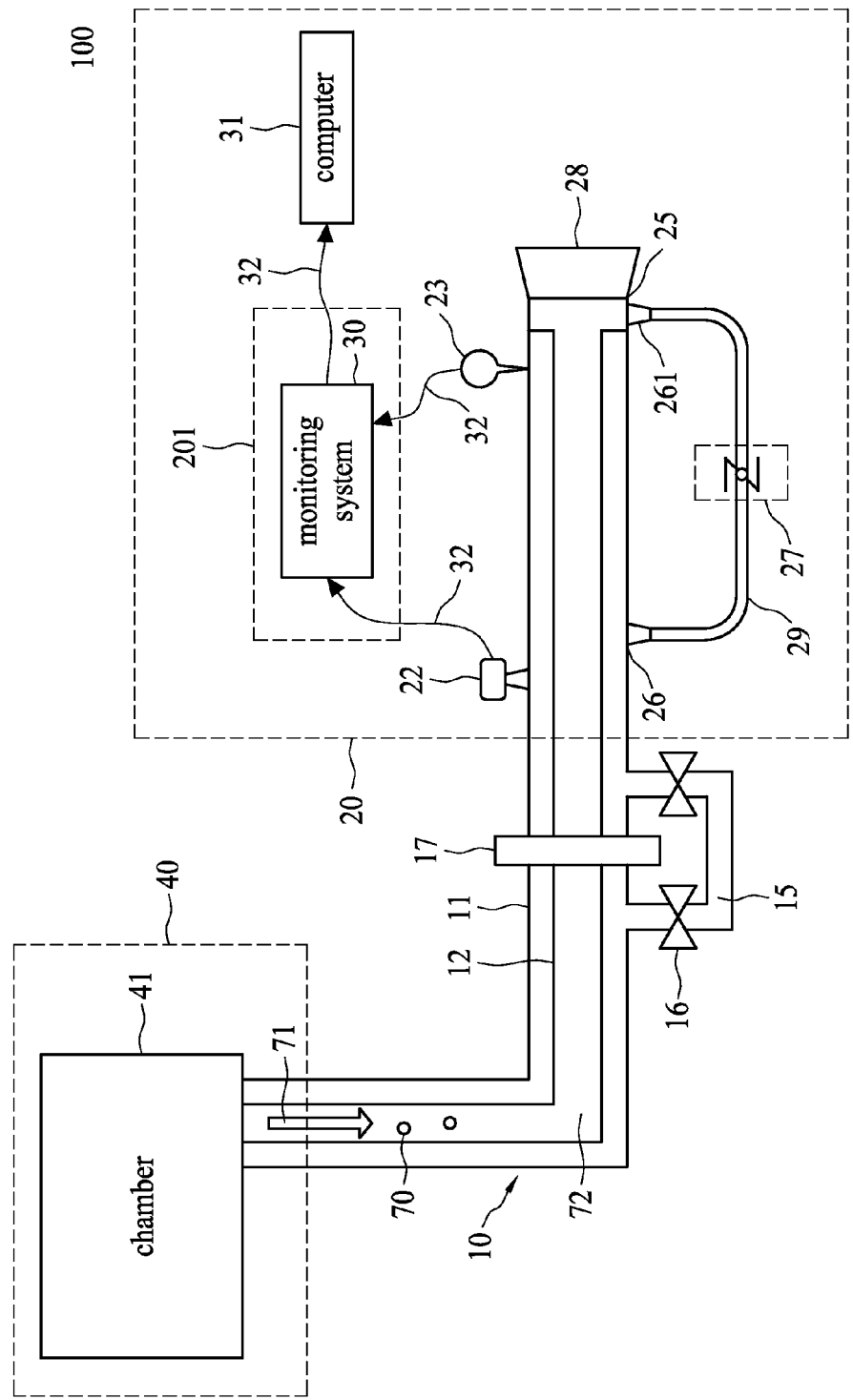
FIG. 2 is a schematic diagram of a system for exhaust dissipation, in accordance with some embodiments of the present disclosure.

In FIG. 2, pump 28 is used to extract the exhaust 70 through the inner tube 12. The pump 28 is coupled to the inner tube 12 and configured to decrease a pressure inside the inner tube 12. The pump 28 is also coupled to the outer tube 11 and configured to decrease a pressure inside the outer tube 11. One end of a passage tube 29 is configured to couple to the outer tube 11 at an opening 26, and another end of the passage tube 29 is configured to couple to the inner tube 12 at an opening 261. The opening 261 is proximate to the terminal 25 of the inner tube 12. The pump 28 is configured to suck air from outer tube 11 at opening 26 to the opening 261 near terminal 25 and out to atmosphere. The outer tube 11 is vacuum sealed except at the opening 26.

Valve 27 is coupled in between the opening 26 and the opening 261. The valve 27 is configured to prevent exhausts 70, gas, or other particles passing from the inner tube 12 to the outer tube 11. The valve 27 is configured to prevent any direction of flow into outer tube 11 regardless of whether the pump 28 is turning on or off.

Figure 3:
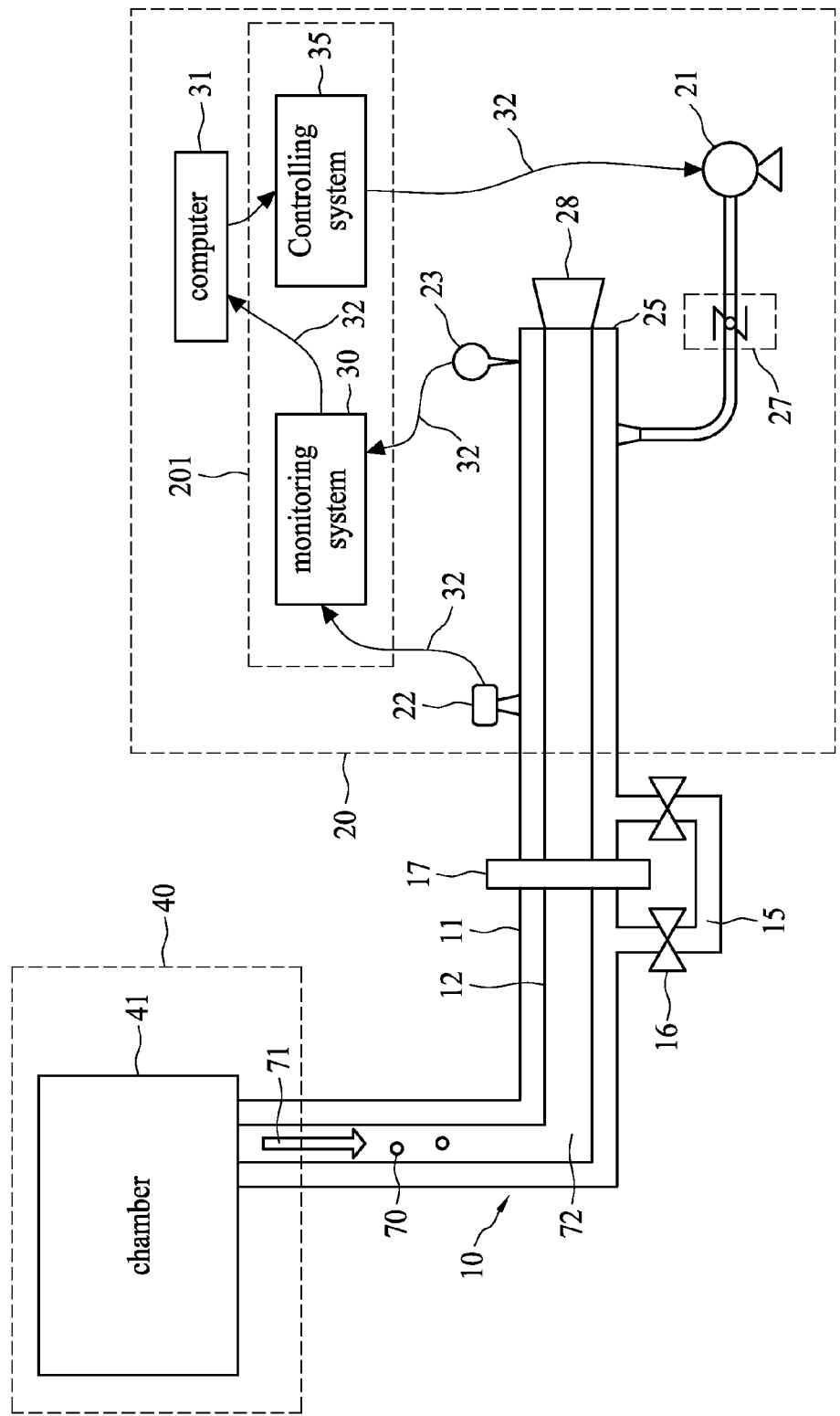
FIG. 3 is a schematic diagram of a system for exhaust dissipation, in accordance with some embodiments of the present disclosure.

In FIG. 3, the hub 201 further includes a controlling system 35. The controlling system 35 is coupled to the computer 31 and the pump 21 through signal line 32. The signal line 32 is configured to transmit signal through any suitable means such as using a wire or wireless communication.

Figure 4:
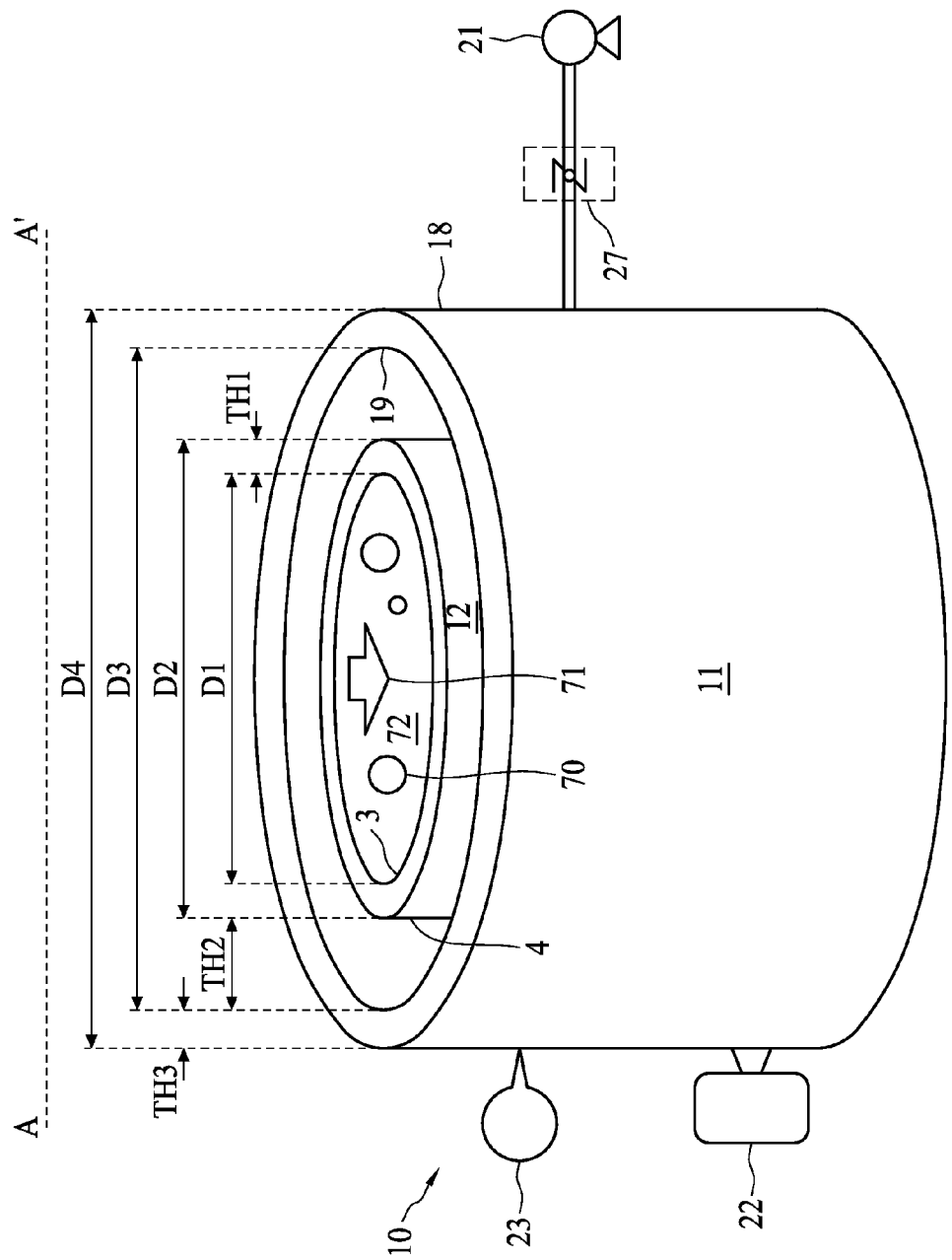
FIG. 4 is a perspective view of a pipeline, in accordance with some embodiments.

FIG. 4 is a diagrammatic perspective view of the pipeline 10. The inner tube 12 is disposed substantially parallel within the outer tube 11. Exhausts 70 are passing through the inner tube 12 at a transporting direction 71. The inner tube 12 includes a thickness TH1 from an inner wall 3 to an outer wall 4 of the inner tube 12. The outer tube 11 includes a thickness TH3 from an inner wall 19 to an outer wall 18 of the outer tube 11. In some embodiments, the thickness TH3 is around 5 centimeters. The inner tube 12 includes an inner diameter D1 encircled by inner wall 3. The inner tube 12 includes an outer diameter D2 encircled by outer wall 4. The outer tube 11 includes an inner diameter D3 encircled by inner wall 19. The outer tube 11 includes an outer diameter D4 encircled by outer wall 18. A cross sectional line AA' is drawn on top of the pipeline 10.

Figure 5:
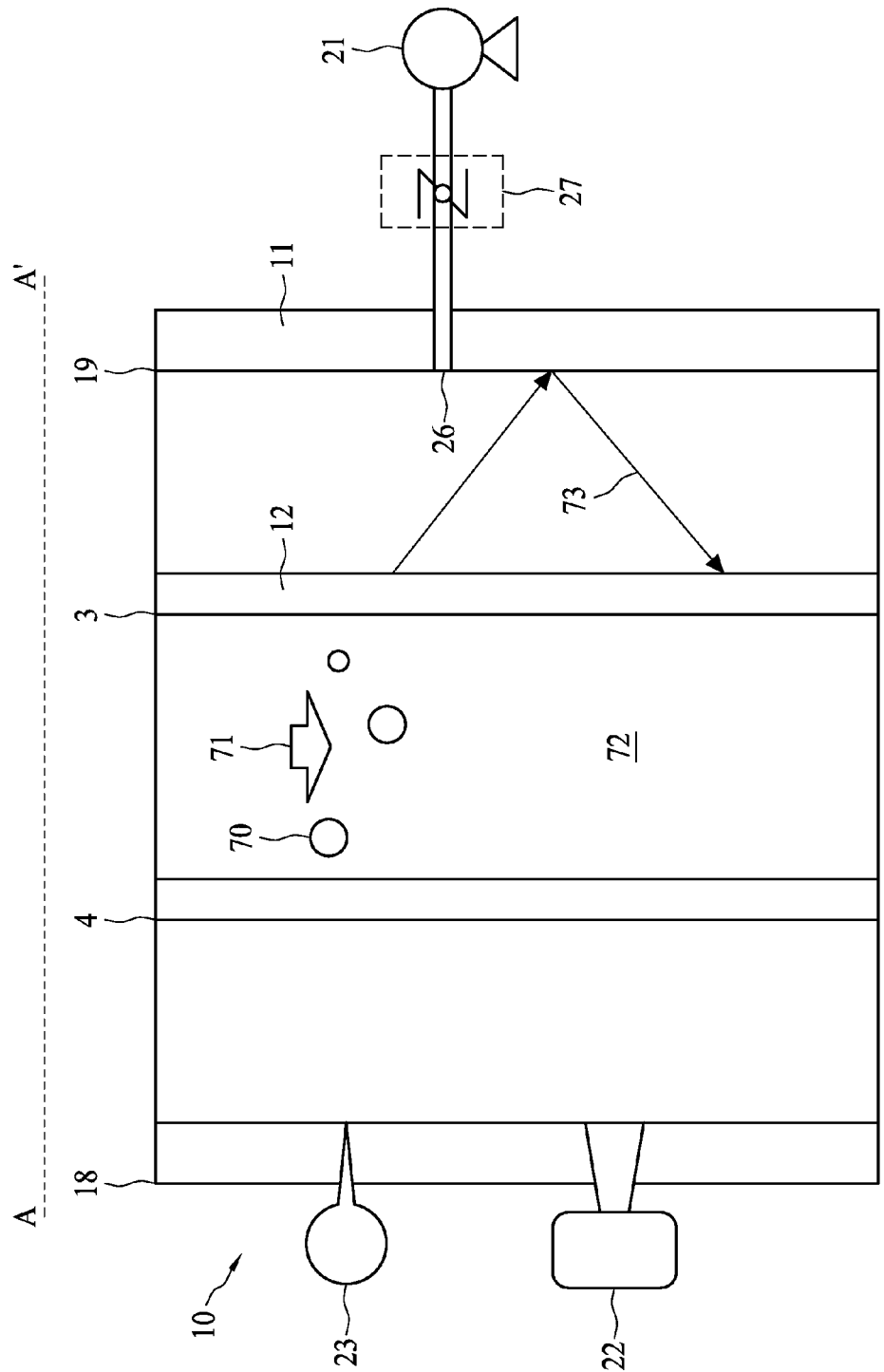
FIG. 5 is a cross-sectional view of a pipeline, in accordance with some embodiments.

In FIG. 5, a cross sectional view of the pipeline 10 is illustrated. The cross sectional view is from the cross sectional line AA'. In some embodiments, an inner wall 19 of the outer tube 11 is configured to keep a thermal radiation 73 within the double tube. In some embodiments, the inner wall 19 of the outer tube 11 is configured to be a radiation reflective surface. Radiative heat is retained within inner tube 12 by reflecting thermal radiation 73 from outer tube 11 back to inner tube 12. In some embodiments, the inner wall 19 is polished or coated with a reflective material.

Figure 6:
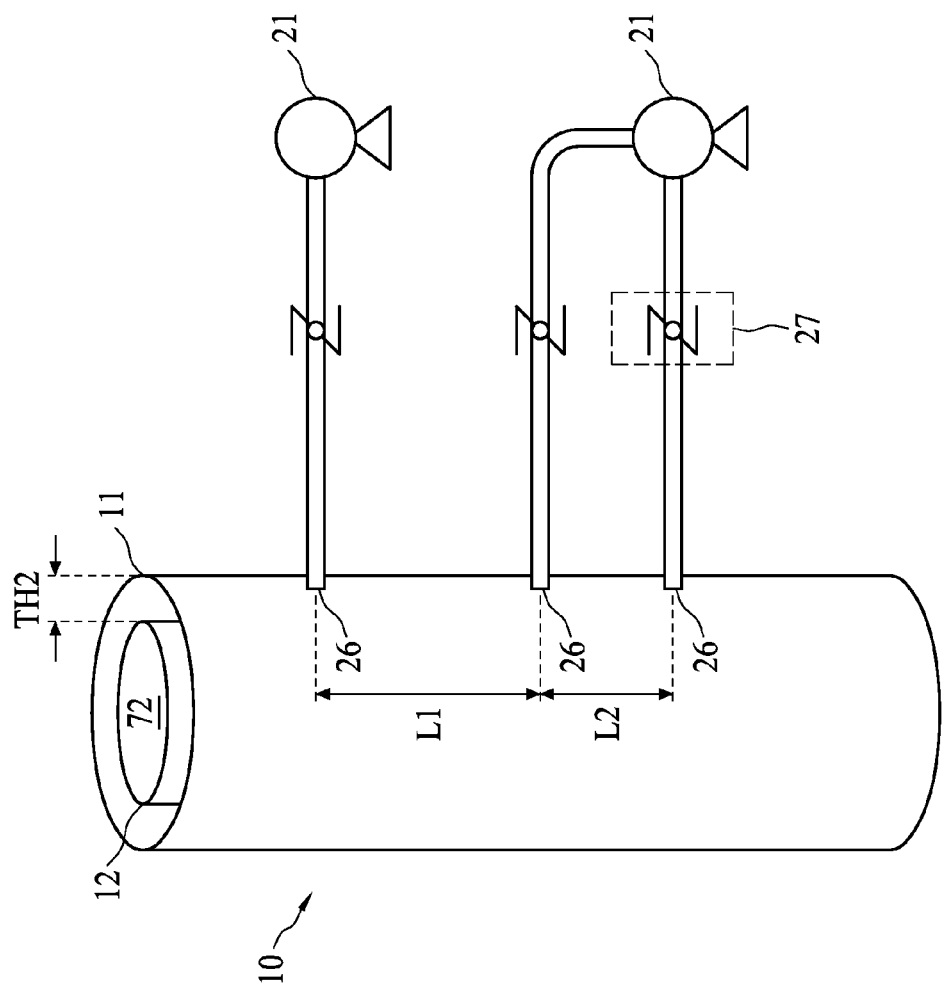
FIG. 6 is a perspective view of a pipeline, in accordance with some embodiments.

FIG. 6 illustrates another embodiment of the present disclosure. In FIG. 6, a plurality of the pump 21 is coupled with the outer tube 11 of the pipeline 10. The pumps 21 are coupled with the outer tube 11 at the openings 26. The openings 26 are distanced from each other by a length L1. The length L1 is configured to adjust a uniformity of the pressure in the outer tube 11. For example, the pressure near an opening 26 is approximately less than the pressure far from the opening 26.

Figure 7:
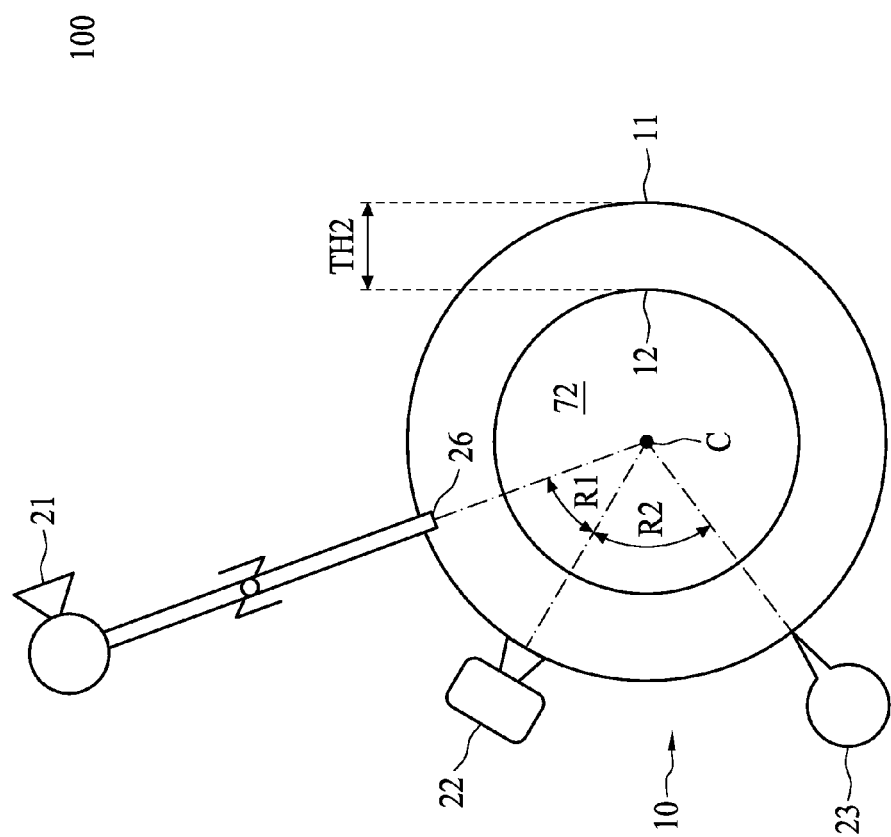
FIG. 7 is a plan view of a pipeline, in accordance with some embodiments.

FIG. 7 illustrates a plan view of the pipeline 10. A center C is at a center of the inner tube 12 and the outer tube 11. The pump 21 is coupled to the outer tube 11 at the opening 26. The gauge 22 is positioned on the outer tube 11 at a degree of angle R1 from the opening 26. The temperature sensing device 23 is positioned on the outer tube 11 at a degree of angle R2 from the gauge 22.

Figure 8:
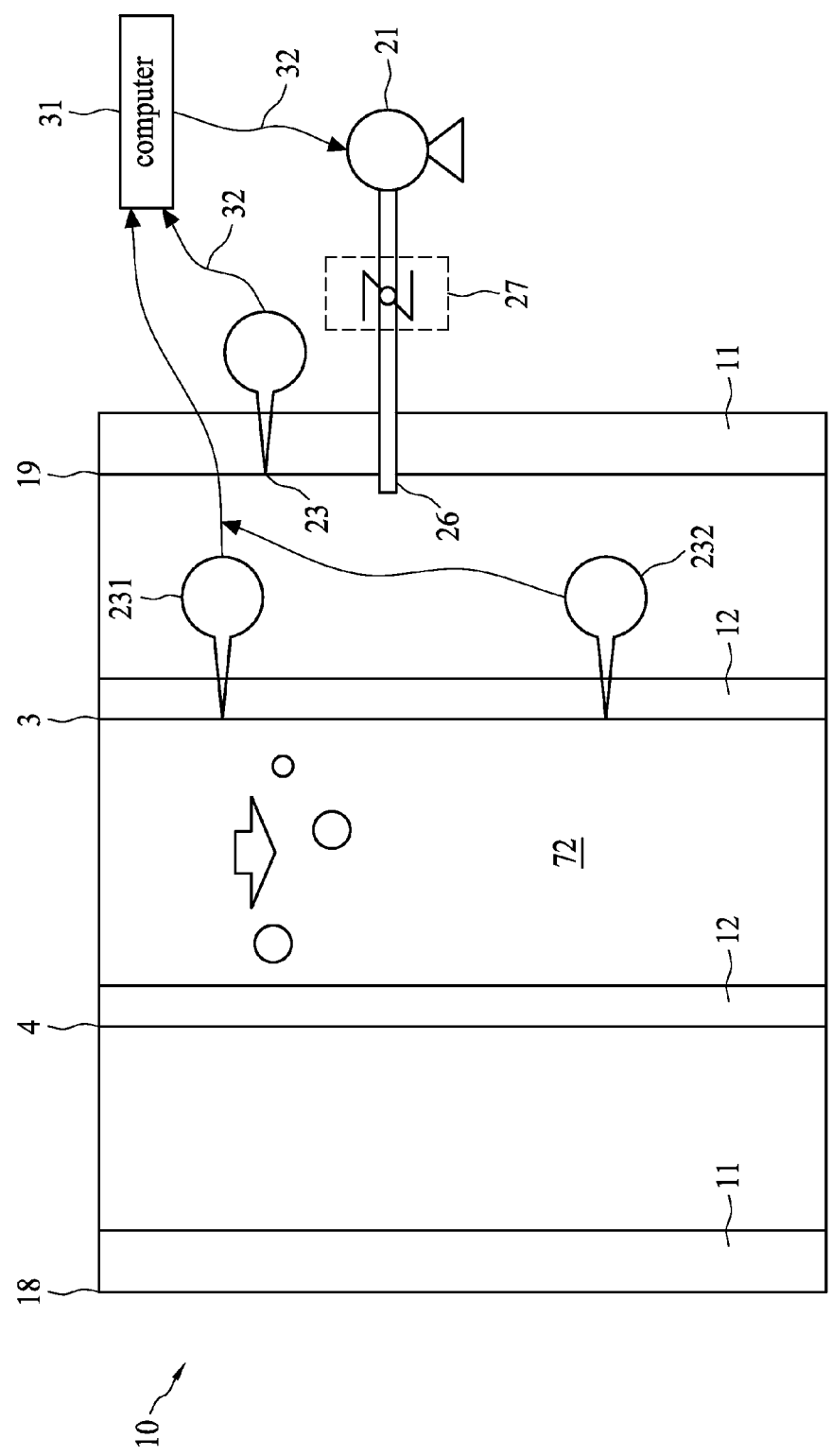
FIG. 8 is a cross-sectional view of a pipeline, in accordance with some embodiments.

In FIG. 8, temperature sensing device 23 is configured to sense a temperature inside the outer tube 11. Temperature sensing device 231 is configured to sense a temperature inside the inner tube 12. The temperature sensing device 231 is configured to sense temperature of the exhaust 70 passing through the inner tube 12. In some embodiments, the temperature sensing device 231 is configured to transmit a temperature signal of the inner tube 12 to a computer 31. The computer 31 is configured to adjust a pumping speed of the pump 21 in response to a change in the temperature in the inner tube 12. The temperature sensing device 231 is configured to transmit the temperature signal through a signal line 32. In some embodiments, signal line 32 is configured to transmit signal through a wire or electromagnetic wave.

Figure 9:
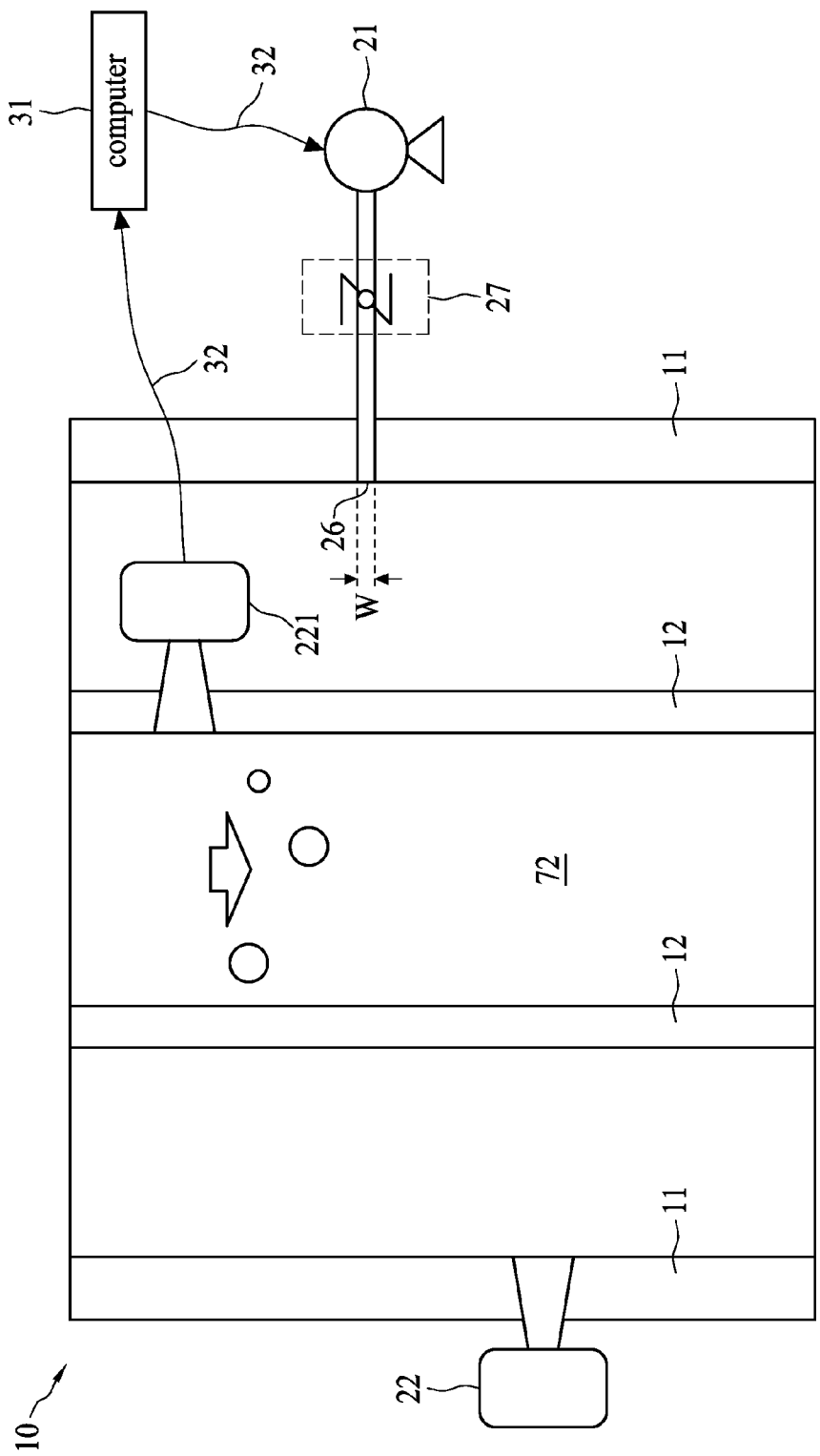
FIG. 9 is a cross-sectional view of a pipeline, in accordance with some embodiments.

In FIG. 9, one gauge 22 is configured to sense a pressure in the outer tube 11. Another gauge 221 is configured to sense a pressure in the inner tube 12. The gauge 221 is configured to sense pressure of gaseous form of the exhaust 70 passing through the inner tube 12. In some embodiments, the gauge 221 is configured to transmit a pressure signal to a computer 31. The computer 31 is configured to adjust a pumping speed of a pump 21 in response to a change in the pressure in the inner tube 12. The gauge 221 is configured to transmit the pressure signal to the computer 31 through a signal line 32. The signal line 32 is configured to transmit signal through wire or wireless line. Pump 21 is coupled to the outer tube 11 at an opening 26. In some embodiments, a width W of the opening 26 is a predetermined width according to a vacuuming rate.

Figure 10:
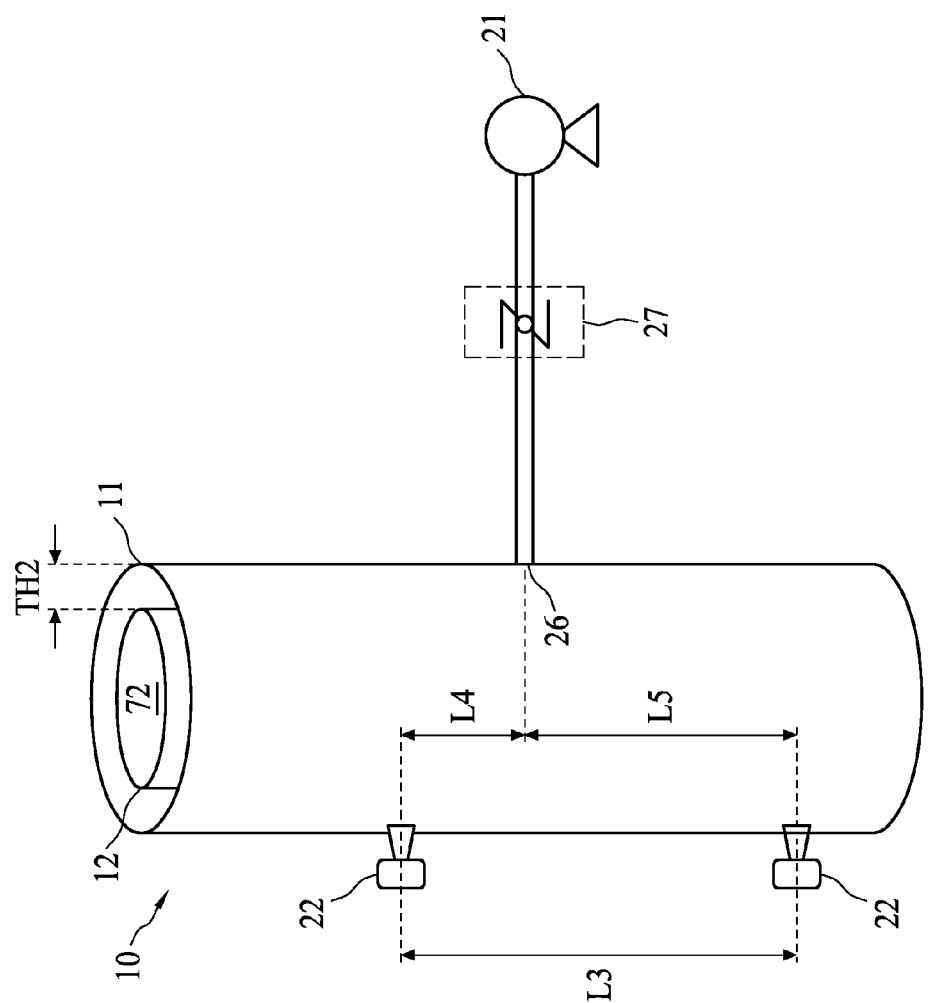
FIG. 10 is a perspective view of a pipeline, in accordance with some embodiments.

In FIG. 10, a gauge 22 is positioned away from another gauge 22 by a length L3. A gauge 22 is disposed from the opening 26 by a length L4. Another gauge 22 is disposed from the same opening 26 by a length L5. In some embodiments, length L3 is within a predetermined range. For example, length L3 is around 1 meter. Gauge 22 is positioned away from another gauge 22 by around 1 meter.

Figure 11:
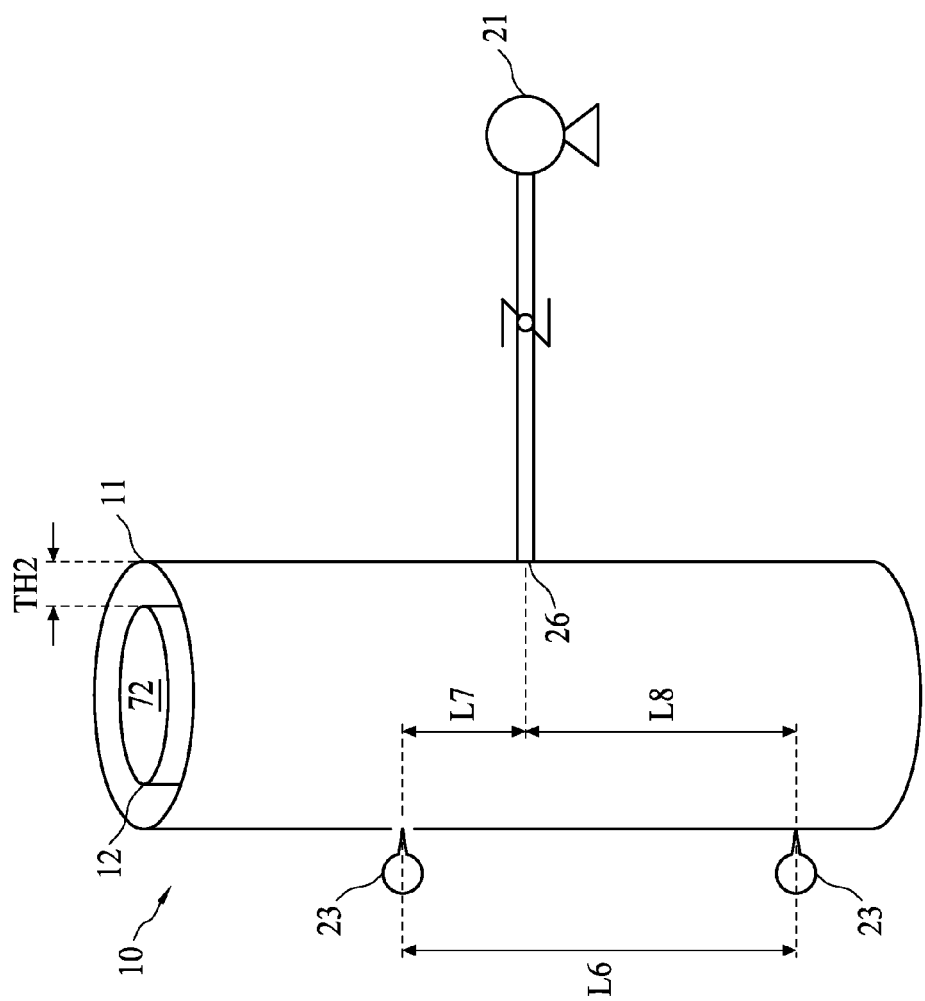
FIG. 11 is a perspective view of a pipeline, in accordance with some embodiments.

In FIG. 11, a temperature sensing device 23 is positioned away from another temperature sensing device 23 by a length L6. A temperature sensing device 23 is disposed from the opening 26 by a length L7. Another temperature sensing device 23 is disposed from the same opening 26 by a length L8.

Figure 12:
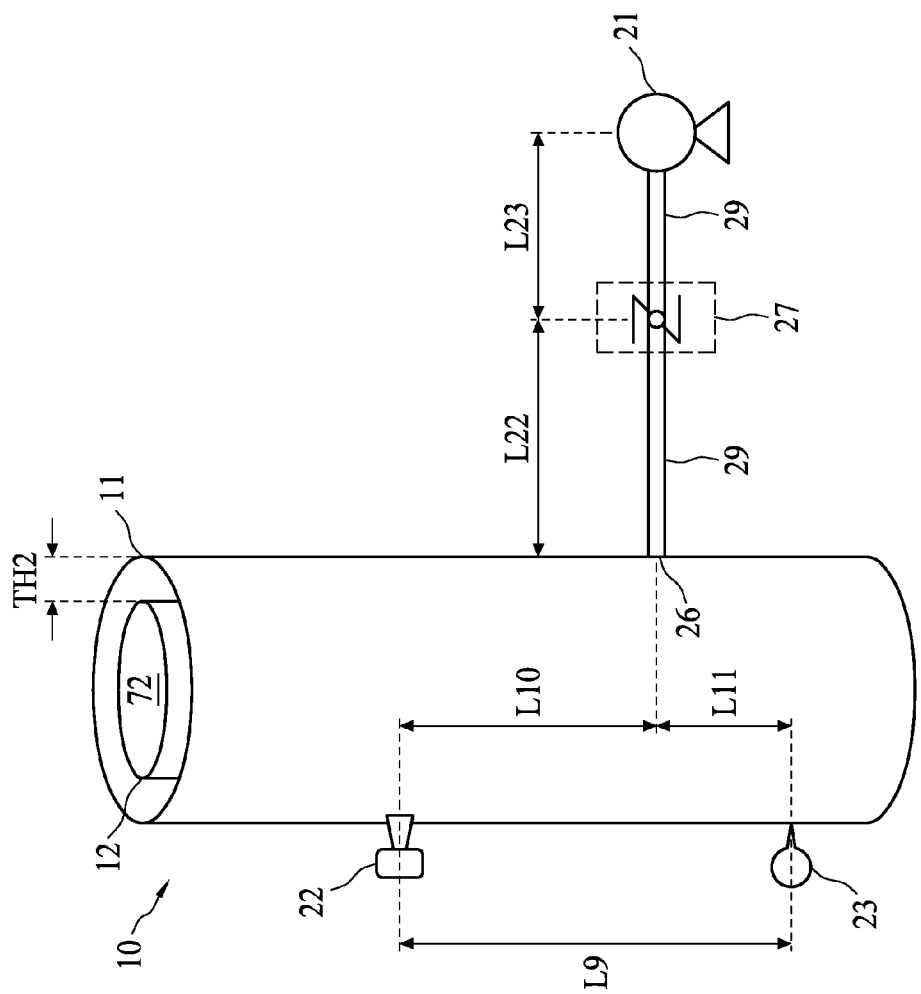
FIG. 12 is a perspective view of a pipeline, in accordance with some embodiments.

In FIG. 12, a gauge 22 is positioned away from a temperature sensing device 23 by a length L9. The gauge 22 is disposed from the opening 26 by a length L10. The temperature sensing device 23 is disposed from the same opening 26 by a length L11. The pump 21 is coupled to a valve 27 through a passage tube 29. The passage tube 29 includes a length L23 measured from the pump 21 to the valve 27. The passage tube 29 includes a length L22 measured from the valve 27 to the opening 26.

Figure 13:
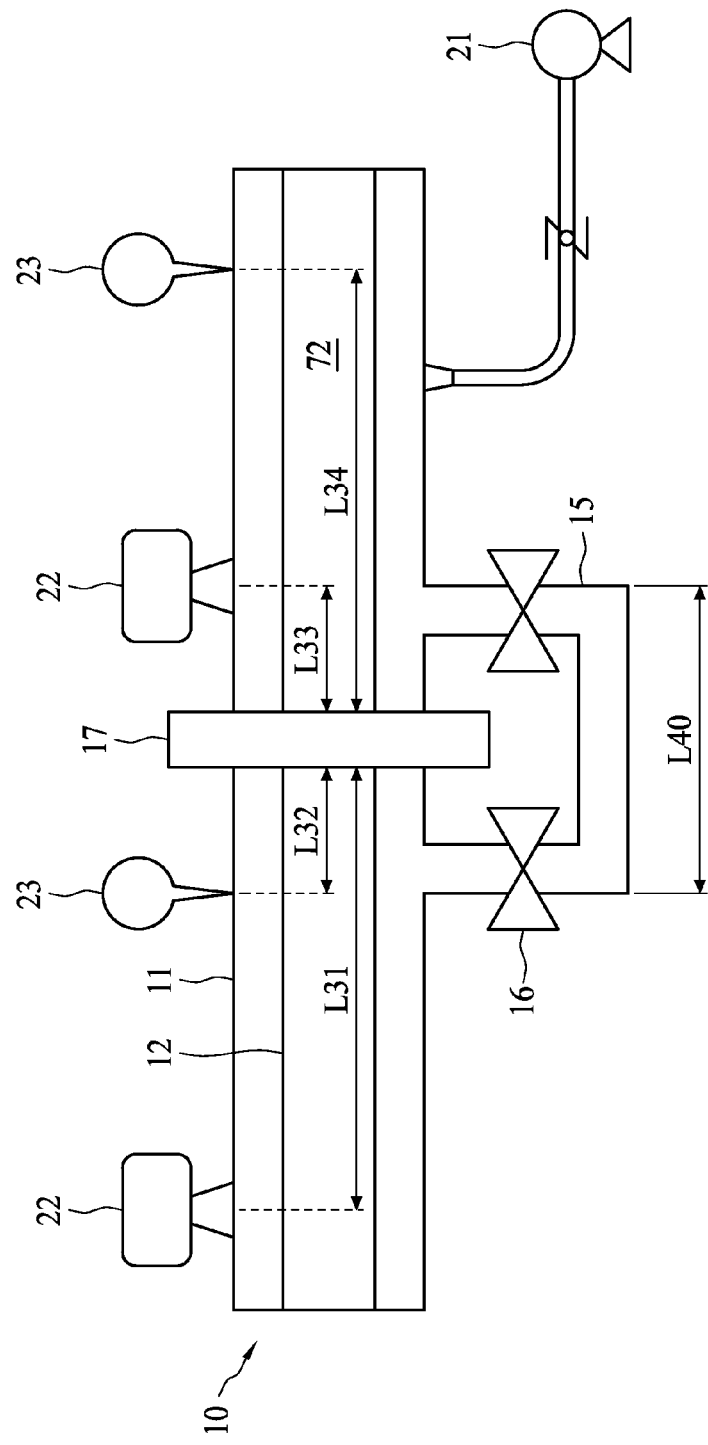
FIG. 13 is a cross-sectional view of a pipeline, in accordance with some embodiments.

FIG. 13 illustrates a flange 17 in between different sections of the double pipe. At one side of the flange 17, a gauge 22 is positioned from the flange 17 by a length L31. A temperature sensing device 23 is positioned away from the flange 17 by a length L32. At another side of the flange 17, another gauge 22 is positioned from the flange 17 by a length L34. Another temperature sensing device 23 is positioned away from the flange 17 by a length 33. In some embodiments, length L31 and length L33 are about the same.

Figure 14:
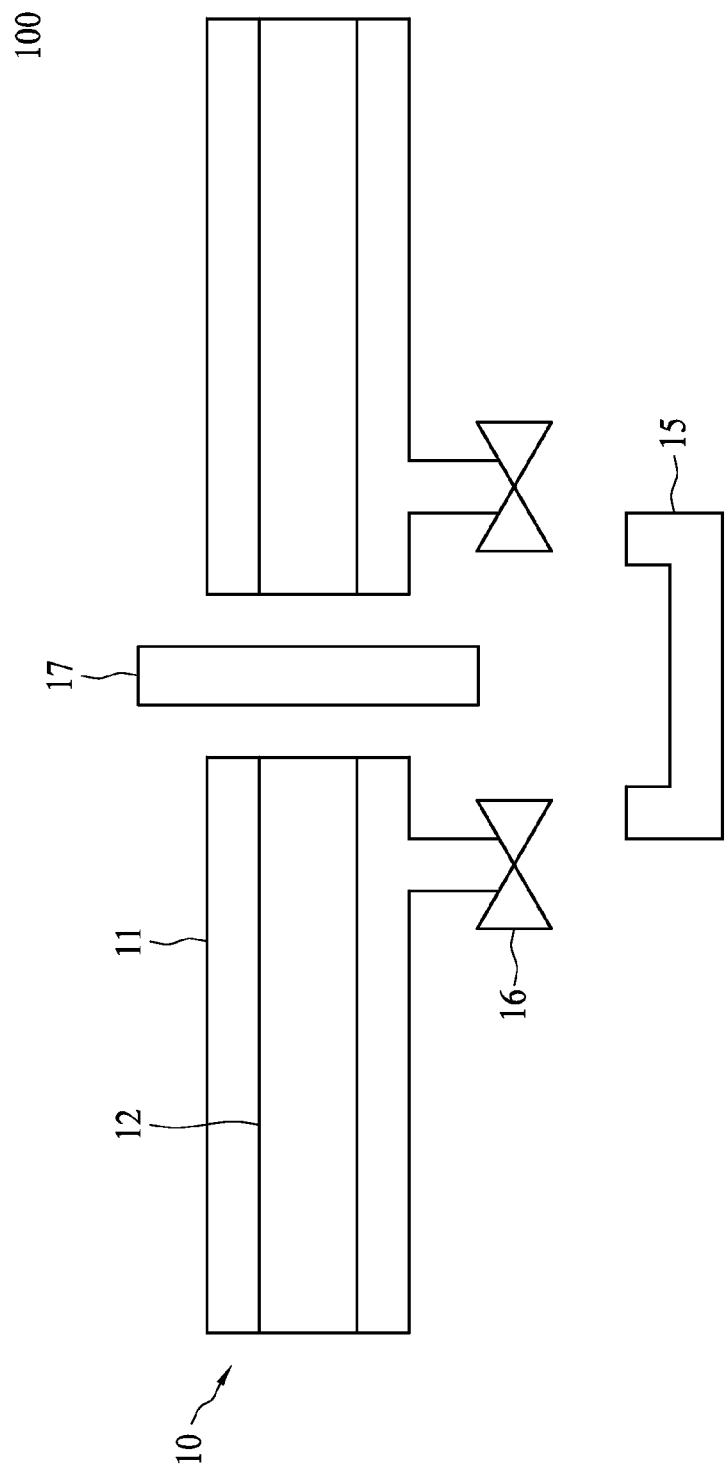
FIG. 14 is a cross-sectional view of a pipeline, in accordance with some embodiments.

In FIG. 14, different sections of the pipeline 10 are separated. Different sections of the pipeline 10 are configured to be detachable from each other. In some embodiments, taking apart different sections of the pipeline 10 is for cleaning the pipeline 10. The operation of cleaning is for inner tube 12, outer tube 11, flange 17, or intermediate tube 15. In some embodiments, the intermediate tube 15 is detached, following by detaching one section of the pipeline 10 from the flange 17 and then the other. After the operation of cleaning, different sections of the pipeline 10 are coupled back together by a reverse order.

Figure 15:
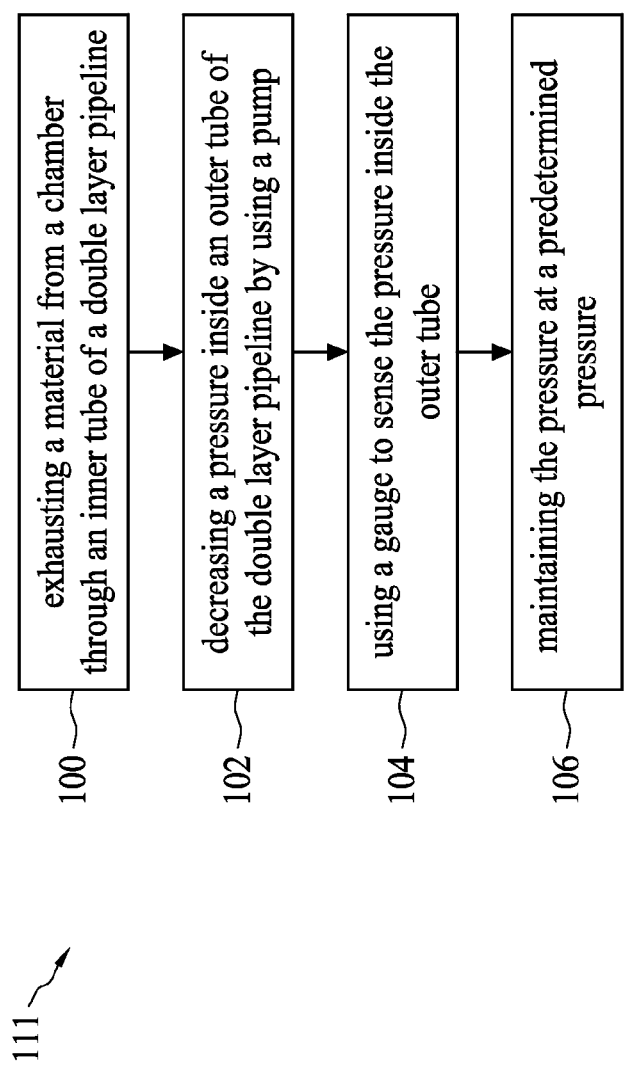
FIG. 15 is an operational flow of a method for dissipating process exhaust, in accordance with some embodiments.

In FIG. 15, a method 111 is illustrated. FIG. 15 illustrates a process flow for dissipating process exhaust 70 in FIG. 1. The method 111 is a method of dissipating a process exhaust 70 from the chamber 41. Operation 100 exhausts exhaust 70 from a chamber 41 through an inner tube 12 of a double layer pipeline 10. Exhausting the exhaust 70 is by conveying the process exhaust 70 from the chamber 41 through an inner tube 12 of a pipeline 10 to abatement.

Operation 102 decreases pressure inside outer tube 11 of the double layer pipeline 10 by using the pump 21. Operation 104 uses gauge 22 to sense pressure inside the outer tube 11. Sensing pressure inside the outer tube 11 is sensing pressure in the outer portion. Operation 106 maintains pressure inside the outer tube 11 at a predetermined pressure. Operation 106 maintains an outer tube 11 of the pipeline 10 at a vacuum state by pump 21 such that the inner tube 12 is substantially thermal isolated from the atmosphere outside the pipeline 10. In some embodiments, a difference between the atmosphere pressure and the pressure in the outer tube 11 is compared. Some exemplary embodiments for operation 100, operation 102, operation 104, and operation 106 are illustrated in FIG. 1.

Figure 16:
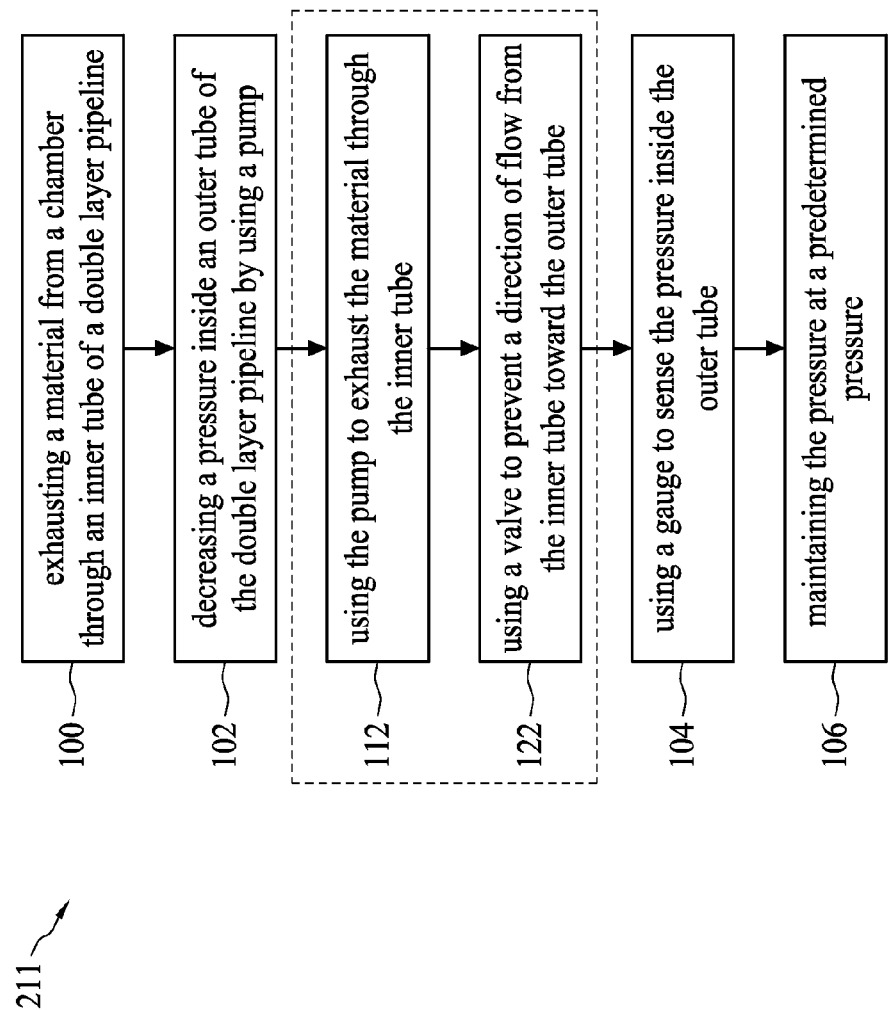
FIG. 16 is an operational flow of a method for dissipating process exhaust, in accordance with some embodiments.

In FIG. 16, a method 211 is illustrated. FIG. 16 illustrates a process flow for dissipating process exhaust 70 in FIG. 2. FIG. 16 includes some additional processes such as operation 112 and operation 122 inserted into the process flow. In FIG. 16, some exemplary embodiments for operation 100, operation 102, operation 112, operation 122, operation 104, and operation 106 are illustrated in FIG. 2. Operation 100 expelled exhaust 70 from a chamber 41 through an inner tube 12 of a double layer pipeline 10. Operation 100 extracts the process exhaust 70, from the chamber 41 through a pump 21. In some embodiments, the pump 21 is a vacuum pump. Operation 102 decreases a pressure inside an outer tube 11 of the double layer pipeline 10 by using the pump 28. Operation 112 uses the pump 28 to expel the exhaust 70 through the inner tube 12. Operation 211 in FIG. 16 differs from operation 111 in FIG. 15 in that operation 102 in FIG. 15 uses a pump 21 not attaching to the terminal 25 in FIG. 1, while operation 102 in FIG. 16 uses a pump 28 attached to the terminal 25 in FIG. 1. Operation 102 in FIG. 16 uses the pump 28 for both dissipating the exhaust 70 in the inner tube 12 and for vacuuming the outer tube 11.

Operation 112 uses a valve 27 to prevent a direction of flow from the inner tube 12 toward the outer tube 11. The valve 27 is used to prevent exhausts 70 from inner tube 12 entering into outer tube 11 through passage tube 29 in FIG. 2. The valve 27 prevents any particles or contamination entering in the outer tube 11. Operation 104 uses a gauge 22 to sense the pressure inside the outer tube 11. Operation 106 maintains the pressure at a predetermined pressure. The valve 27 helps to maintain the pressure inside outer tube 11 at the predetermined pressure by keeping air outside of outer tube 11. Even when the pump 28 is not operating to decrease the pressure inside outer tube 11, the valve 27 is still keeping air from entering into outer tube 11. Keeping air outside of outer tube 11 helps to maintain the pressure inside outer tube 11 at the predetermined pressure.

Figure 17:
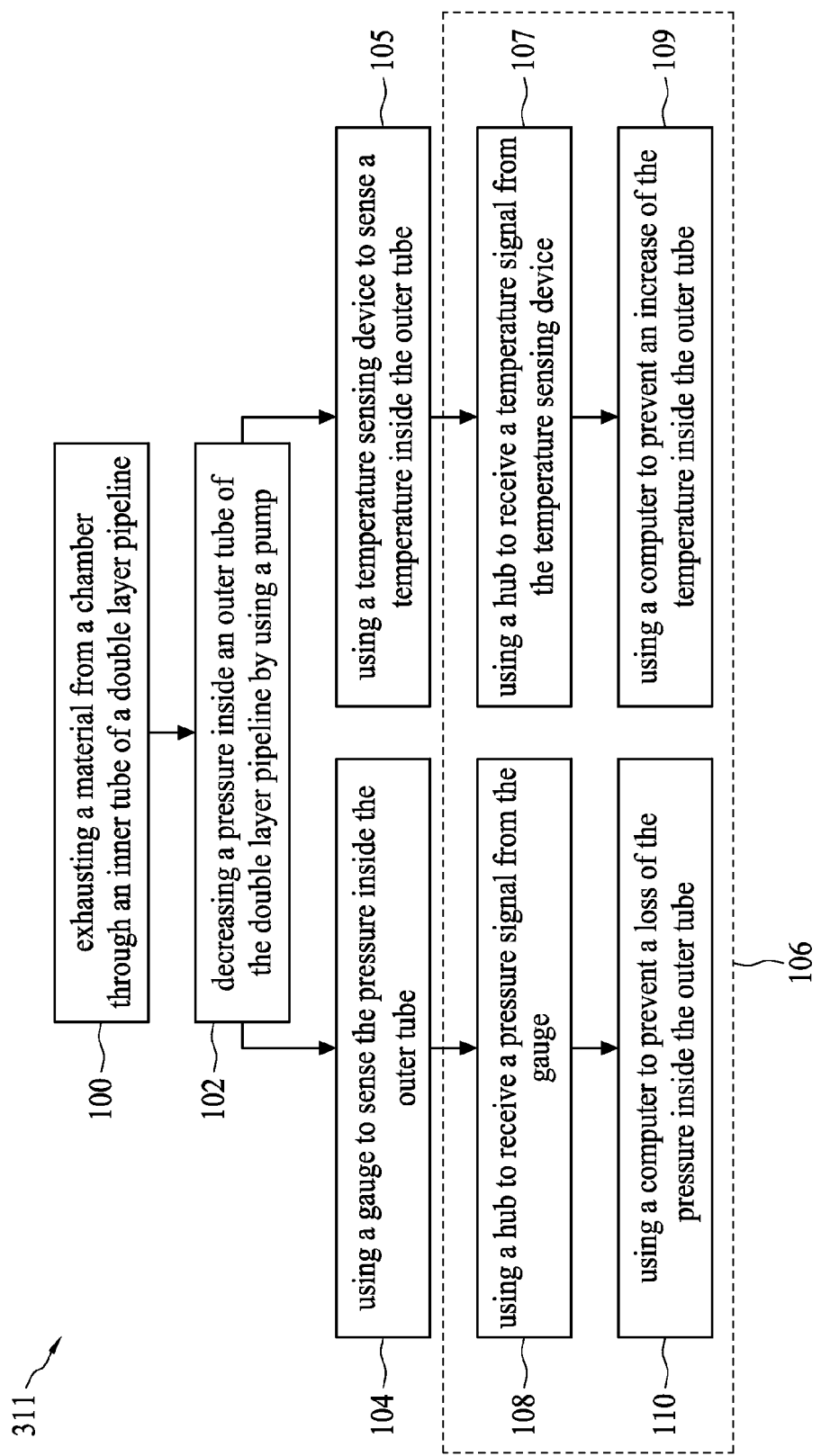
FIG. 17 is an operational flow of a method for monitoring a dissipation process, in accordance with some embodiments.

In FIG. 17, a method 311 is illustrated. FIG. 17 illustrates a process flow for dissipating process exhaust 70 in FIG. 3. In FIG. 17, some exemplary embodiments for operation 100, operation 102, operation 104, operation 106, operation 108, operation 110, operation 105, operation 107, and operation 109 are illustrated in FIG. 1, or FIG. 2. FIG. 17 includes some additional processes such as operation 105, operation 107, and operation 109 inserted into the process flow. The process flow includes measuring a temperature inside the outer tube 11. Operation 106 in FIG. 15 is expanded to include sub operations such as operation 108, and operation 110. Operation 102 is follow by operation 104 and operation 105. Operation 104 uses a gauge 22 to sense the pressure inside the outer tube 11. Operation 105 uses a temperature sensing device 23 to sense a temperature inside the outer tube 11. Sensing temperature inside the outer tube 11 is sensing temperature in the outer portion.

In operation 106, preventing a loss of the pressure inside the outer tube 11 also includes operation 108, and operation 110. Operation 108 uses a hub 201 to receive a pressure signal from the gauge 22. The hub 201 includes a monitoring system 30 for receiving the pressure signal. In response to the pressure signal from the gauge 22, the monitoring system 30 transmits the pressure signal to the computer 31. In some embodiments, the pressure signal is transmitting to the computer 31 through the signal line 32. Operation 110 uses a computer 31 to prevent a loss of the pressure inside the outer tube 11. In response to a detecting of a drop in the pressure inside the outer tube 11, the computer 31 generates some signals or alarms for further action to prevent the loss of the pressure inside the outer tube 11.

In operation 106, preventing a loss of the pressure inside the outer tube 11 includes operation 107, and operation 109. Operation 107 uses hub 201 to receive a temperature signal from the temperature sensing device 23. The hub 201 includes a monitoring system 30 for receiving the temperature signal. In response to the temperature signal from the temperature sensing device 23, the monitoring system 30 transmits the temperature signal to the computer 31. In some embodiments, the temperature signal is transmitting to the computer 31 through the signal line 32. Operation 109 uses computer 31 to prevent an increase of the temperature inside the outer tube 11. In some embodiments, when increasing heat is transferred to the outer tube 11, the temperature inside the outer tube 11 increases and pressure inside the outer tube 11 decreases. In response to a detecting of a rising in the temperature inside the outer tube 11, the computer 31 generates some signals or alarms for further action to prevent the loss of the pressure inside the outer tube 11.

Figure 18:
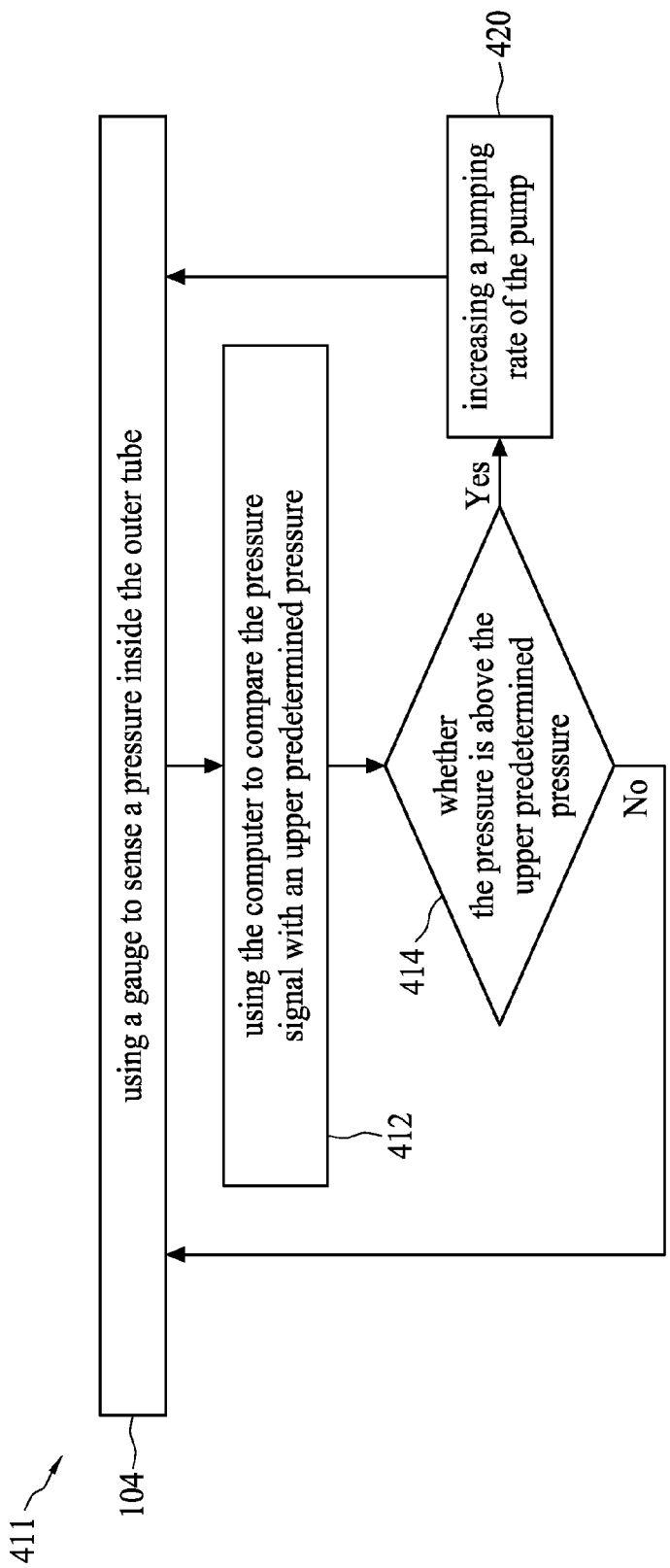
FIG. 18 to FIG. 27 are some operational flows of some method for maintaining some dissipation condition, in accordance with some embodiments.

In FIG. 18, a method 411 is illustrated. FIG. 18 illustrates a process flow for dissipating process exhaust 70. In some embodiments, the process flow uses a pump 21 and a pump 28 separately as illustrated in FIG. 3. In some other embodiments, the process flow uses a pump 28 for reducing a pressure inside inner tube 12 and also a pressure inside outer tube 11 as illustrated in FIG. 2. In FIG. 18, some exemplary embodiments for operation 104, operation 412, operation 414, and operation 420 are illustrated in FIG. 3 or FIG. 2.

Operation 104 uses a gauge 22 to sense a pressure inside the outer tube 11. Operation 412 uses the computer 31 to compare the pressure signal with an upper predetermined pressure. Operation 414 determines whether the pressure is above the upper predetermined pressure. Upon determining the pressure is above the upper predetermined pressure, a pumping rate of the pump 21 is increased in operation 420. Increasing the pumping rate of the pump 21 decreases the pressure inside the outer tube 11. In some embodiments, operation 420 uses the computer 31 to decrease the pressure. The upper predetermined pressure is an upper limit of a suitable pressure range. The suitable pressure range includes the upper predetermined pressure and lower predetermined pressure. When the pressure inside outer tube 11 is above the upper predetermined pressure, particles or contamination are likely to form inside the inner tube 12. In some embodiments, the upper predetermined pressure is in a pressure range from $10^{-2}$ torr to $10^{-3}$ torr, or from $10^{-3}$ torr to $10^{-4}$ torr. The process flow repeats back to operation 104 to use the gauge 22 to sense a pressure inside the outer tube 11. Upon determining the pressure is not above the upper predetermined pressure in operation 414, the process flow loops back to operation 104 to sense a pressure inside the outer tube 11 again by using the gauge 22. The method 411 maintains the pressure in the outer tube 11 by adjusting a pumping speed of the pump 21 when the pressure in the outer tube 11 is above the upper predetermined pressure.

Figure 19:
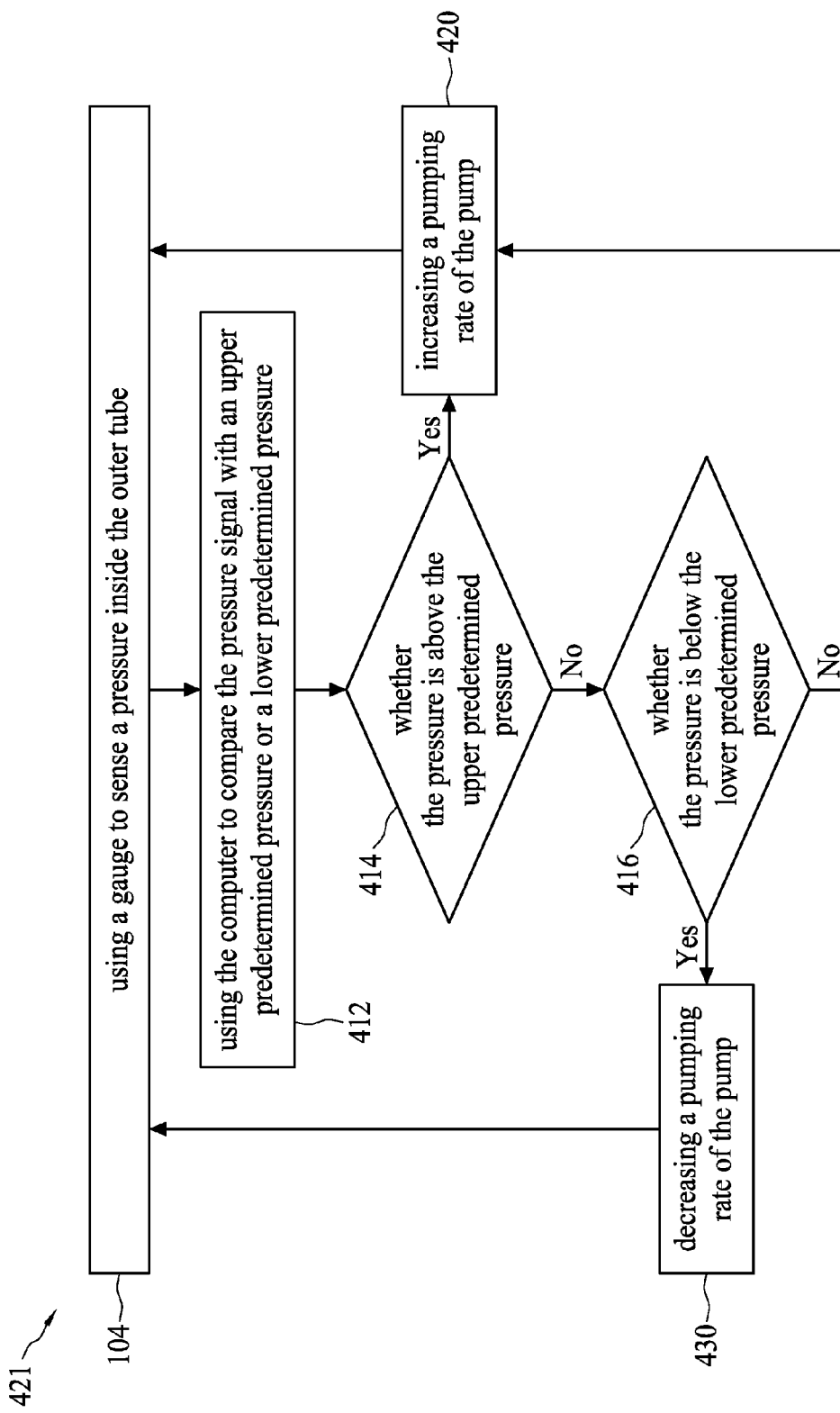

In FIG. 19, a method 421 is illustrated. In some embodiments, FIG. 19 illustrates a process flow for dissipating process exhaust 70 as illustrated in FIG. 2 or FIG. 3. In FIG. 19, some exemplary embodiments for operation 104, operation 412, operation 414, operation 416, operation 420, and operation 430 are illustrated in FIG. 3 or FIG. 2. A difference between FIG. 18 and FIG. 19 is an addition of operation 416, operation 430, and some processes in operation 412.

Operation 104 uses a gauge 22 to sense a pressure inside the outer tube 11. Operation 412 uses the computer 31 to compare the pressure signal with an upper predetermined pressure or a lower predetermined pressure. Operation 414 determines whether the pressure is above the upper predetermined pressure. Upon determining the pressure is above the upper predetermined pressure, a pumping rate of the pump 21 is increased in operation 420. Increasing the pumping rate of the pump 21 decreases the pressure inside the outer tube 11. In some embodiments, operation 420 uses the computer 31 to decrease the pressure upon detecting the pressure is above the upper predetermined pressure.

Upon determining the pressure inside outer tube 11 is not above the upper predetermined pressure in operation 414, whether the pressure inside outer tube 11 is below a lower predetermined pressure is determined in operation 416. The lower predetermined pressure is an under limit in the suitable pressure range. When the pressure inside outer tube 11 is lower than the under predetermined pressure, pressure inside the outer tube 11 is suitable for preventing condensation or dust forming inside the inner tube 12. In some embodiments, the lower predetermined pressure is in a pressure range from $10^{-5}$ torr to $10^{-6}$ torr, or from $10^{-6}$ torr to $10^{-7}$ torr. Upon determining the pressure inside outer tube 11 is not below the lower predetermined pressure in operation 416, a pumping rate of the pump 21 is increased in operation 420. Upon determining the pressure is below the lower predetermined pressure in operation 416, a pumping rate of the pump 21 is decreased in operation 430. The pressure inside outer tube 11 is increased by decreasing the pumping rate of the pump 21 in operation 430. In some embodiments, operation 430 uses the computer 31 to control the pumping rate of the pump 21 upon detecting the pressure inside the outer tube 11 is outside the suitable pressure range.

The pumping rate of the pump 21 is increased or decreased by using a controlling system 35 in FIG. 3 to adjust the pumping speed of the pump 21. In some embodiments, in operation 430, a pumping rate of the pump 28 in FIG. 2 is adjusted. For example, decreasing the pumping rate of the pump 28 in FIG. 2 increases both the pressure inside the outer tube 11 and the pressure inside the inner tube 12.

After operation 430, the process flow repeats back to operation 104 to use the gauge 22 to sense a pressure inside the outer tube 11 again. The method 421 keeps the pressure inside outer tube 11 inside the predetermined pressure range by adjusting a pumping speed of the pump 21 when the pressure in the outer tube 11 is outside of the suitable pressure range. Decreasing the pumping rate of the pump 28 or the pumping rate of the pump 21 reduces energy consumed by the pump 28 or the pump 21.

Figure 20:
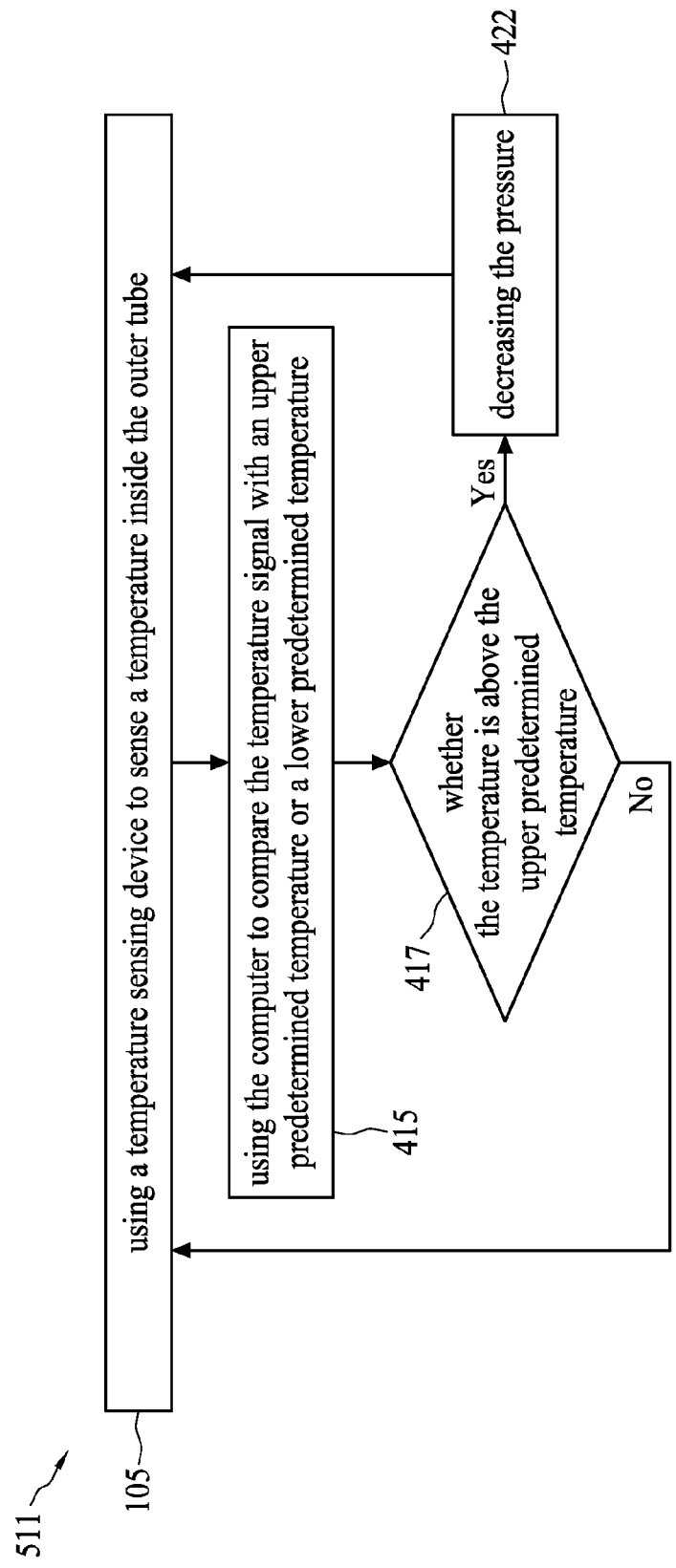

In FIG. 20, a method 511 is illustrated. FIG. 20 illustrates a process flow for dissipating process exhaust 70 in FIG. 3 or FIG. 2. In FIG. 20, some exemplary embodiments for operation 105, operation 415, operation 417, and operation 422 are illustrated in FIG. 3 or FIG. 2.

Operation 105 uses a temperature sensing device 23 to sense a temperature inside the outer tube 11. Operation 415 uses the computer 31 to compare the temperature signal with an upper predetermined temperature. Operation 417 determines whether the temperature is above the upper predetermined temperature. Upon determining the temperature is above the upper predetermined pressure, the pressure inside the outer tube 11 is decreased in operation 422. The pressure inside the outer tube 11 is decreased by increasing a pumping rate of the pump 21 in FIG. 3 or the pumping rate of the pump 28 in FIG. 2.

In some embodiments, operation 422 uses the computer 31 to decrease the pressure inside the outer tube 11 upon detecting the temperature inside the outer tube 11 is above the upper predetermined temperature. The upper predetermined temperature is an upper limit of a suitable temperature range. In some embodiments, when certain amount of heat in inner tube 12 dissipates to the outer tube 11, the temperature inside outer tube 11 reaches above the upper predetermined temperature. Heat dissipation from the inner tube 12 to the outer tube 11 lowers temperature inside the inner tube 12. Lowering temperature inside the inner tube 12 increases a probability of condensation inside the inner tube 12. To prevent the contamination by the condensation inside inner tube 12, the pressure inside the outer tube 11 is decreased. The pressure inside the outer tube 11 is the pressure in the outer portion. In some embodiments, the suitable temperature range in the outer tube 11 is associated with the suitable pressure range in the outer tube 11 for a prevention of contamination or dust particles in the inner tube 12.

After the operation 422, the process flow repeats back to operation 105 to use the temperature sensing device 23 to sense a temperature inside the outer tube 11. Upon determining the temperature is not above the upper predetermined temperature in operation 417, the process flow repeats back to operation 105 to use the temperature sensing device 23 to sense a pressure inside the outer tube 11. The method 511 maintains the pressure in the outer tube 11 by decreasing the pressure inside the outer tube 11 when the temperature in the outer tube 11 is above the upper predetermined temperature.

Figure 21:
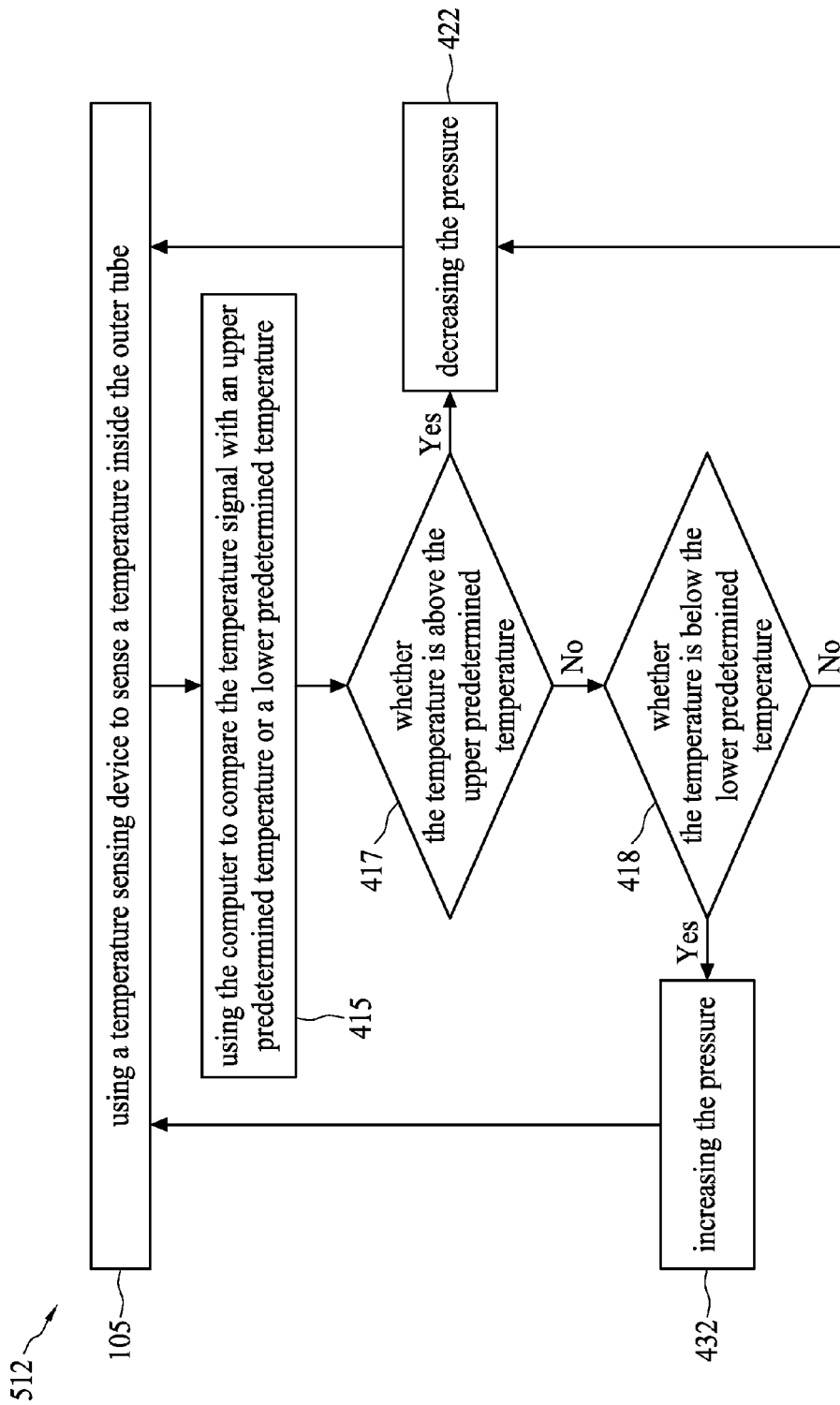

In FIG. 21, a method 512 is illustrated. FIG. 21 illustrates a process flow for dissipating process exhaust 70 in FIG. 3 or FIG. 2. In FIG. 21, some exemplary embodiments for operation 105, operation 415, operation 417, operation 418, operation 422, and operation 432 are illustrated in FIG. 3 or FIG. 2. A difference between FIG. 21 and FIG. 20 is that FIG. 21 includes an addition of operation 418, operation 432, and some processes in operation 415.

Operation 105 uses a temperature sensing device 23 to sense a temperature inside the outer tube 11. Operation 415 uses the computer 31 to compare the temperature signal with an upper predetermined temperature or a lower predetermined temperature. Operation 417 determines whether the temperature is above the upper predetermined temperature. Upon determining the temperature is above the upper predetermined pressure, the pressure inside the outer tube 11 is decreased in operation 422.

Upon determining the temperature is not above the upper predetermined temperature in operation 417, whether the temperature is below the lower predetermined temperature is determined in operation 418. Upon determining the temperature is below the lower predetermined temperature in operation 418, the pressure is increased in operation 432. The pressure in the outer tube 11 is increased by decreasing a pumping rate of the pump 21. Decreasing the pumping rate of the pump 21 reduces energy consumption of the pump 21. Upon determining the temperature is not below the lower predetermined pressure in operation 418, the pressure is decreased in operation 422. Subsequently, the process flow repeats back to operation 105 to use the temperature sensing device 23 to sense a pressure inside the outer tube 11.

The method 512 in FIG. 21 is similar to the method 421 in FIG. 19 except that method 512 maintains the pressure inside the outer tube 11 by adjusting the pressure inside the outer tube 11 base on the temperature inside the outer tube 11.

Figure 22:
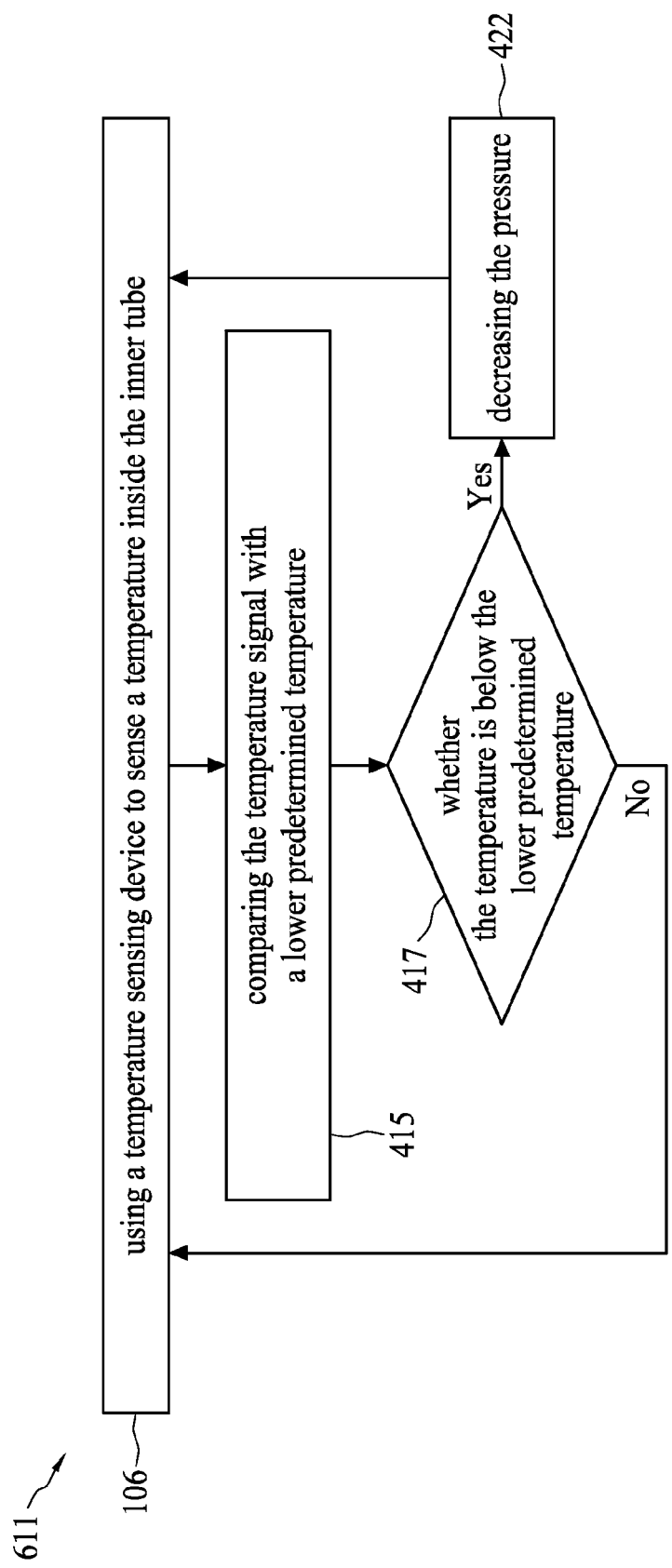

In FIG. 22, a method 611 is illustrated. FIG. 22 illustrates a process flow for dissipating process exhaust 70 as illustrated in FIG. 3 and FIG. 8. FIG. 22 is similar to FIG. 20, except that in FIG. 22, operation 106 replaces operation 105. In operation 105, temperature inside the outer tube 11 is sensed. In operation 106, temperature inside the inner tube 12 is sensed. The method 611 keeps temperature inside the inner portion above a predetermined value such that the process exhaust 70 stays in gas phase throughout the path 72 in the inner tube 12. Temperature inside the inner tube 12 is associated with heat of the exhausts 70 inside the inner tube 12. Temperature inside the outer tube 11 is associated with heat transferred from the inner tube 12 to the outer tube 11. To determine whether exhaust 70 changes from gas phase to another phase, heat dissipation from inner tube 12 to outer tube 11 is detected. In some embodiments, the heat dissipation is detected by sensing temperature in the outer tube 11. In some other embodiments, the heat dissipation is detected by sensing the temperature in the inner tube 12. Sensing temperature in the outer tube 11 detects how much heat is transferred into the outer tube 11. Sensing temperature in the inner tube 12 detects how much heat is transferred out of the inner tube 12. In FIG. 22, some exemplary embodiments for operation 106, operation 415, operation 417, and operation 422, are illustrated in FIG. 8 or FIG. 3.

Operation 106 uses a temperature sensing device 231 to sense a temperature inside the inner tube 12. Operation 415 compares the temperature signal with a lower predetermined temperature. Operation 417 determines whether the temperature in the inner tube 12 is below the lower predetermined temperature. Upon determining the temperature inside the inner tube 12 is below the lower predetermined temperature, the pressure inside the outer tube 11 is decreased in operation 422.

In some embodiments, the pressure inside the outer tube 11 is decreased by increasing a pumping rate of the pump 21. The lower predetermined temperature is a lower limit of a suitable temperature range inside the inner tube 12. When the temperature inside the inner tube 12 is below a phase transition temperature, condensation is formed inside the inner tube 12. The phase transition temperature is a temperature for gas phase transition to other phase such as liquid phase, solid phase, or plasma phase. To prevent the contamination by the forming of particles inside inner tube 12, in some embodiments, the lower predetermined temperature is set to be higher than the phase transition temperature. In some embodiments, the suitable temperature range inside the inner tube 12 is associated with the suitable pressure range inside the outer tube 11. To prevent the contamination, pressure inside the outer tube 11 is decreased in operation 422. The process flow repeats back to operation 104 to use the temperature sensing device 231 to sense a temperature inside the inner tube 12 after the operation 422.

Upon determining the temperature is not above the upper predetermined temperature in operation 417, the process flow loops back to operation 106 to sense a temperature inside the inner tube 12 again. The method 611 maintains the pressure in the outer tube 11 by decreasing the pressure in the outer tube 11 when the temperature in the inner tube 12 is below the lower predetermined temperature.

Figure 23:
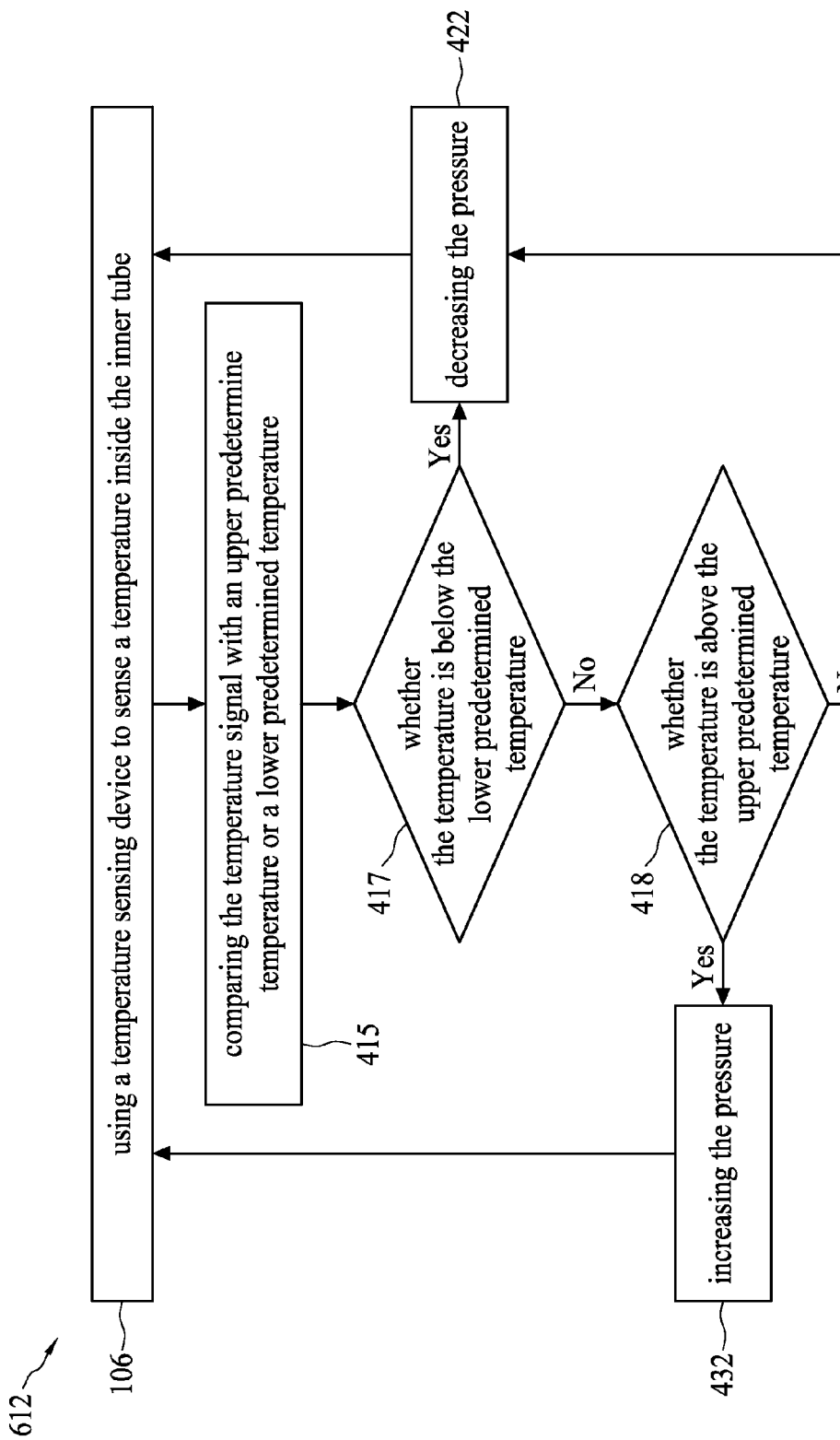

In FIG. 23, a method 612 is illustrated. FIG. 23 illustrates a process flow for dissipating process exhaust 70 as illustrated in FIG. 3 or FIG. 8. FIG. 23 is similar to FIG. 21, except that in FIG. 23, operation 105 changes to operation 106. In operation 105 the temperature sensing device 23 is configured to sense the temperature inside the outer tube 11. In operation 106 the temperature sensing device 231 is configured to sense the temperature inside the inner tube 12. The method 612 in FIG. 23 includes additional operation 418 and operation 432. In FIG. 23, some exemplary embodiments for operation 106, operation 415, operation 417, operation 418, operation 422, and operation 432 are illustrated in FIG. 8 or FIG. 3.

Operation 106 uses a temperature sensing device 231 to sense a temperature inside the inner tube 12. Operation 415 compares the temperature signal with an upper predetermined temperature or a lower predetermined temperature. Operation 417 determines whether the temperature in the inner tube 12 is below the lower predetermined temperature. Upon determining the temperature inside the inner tube 12 is below the lower predetermined pressure, the pressure inside the outer tube 11 is decreased in operation 422. Subsequently, the process flow repeats back to operation 106 to use the temperature sensing device 231 to sense a temperature inside the inner tube 12.

Upon determining the temperature is not below the lower predetermined temperature in operation 417, whether the temperature is above the upper predetermined temperature is determined in operation 418. Upon determining the temperature is above the upper predetermined temperature in operation 418, the pressure is increased in operation 432. In some embodiments, the pressure in the outer tube 11 is increased by decreasing a pumping rate of the pump 21. Subsequently, the process flow repeats back to operation 106 to use the temperature sensing device 231 to sense a temperature inside the inner tube 12. Upon determining the temperature is not above the upper predetermined pressure in operation 418, the pressure is decreased in operation 422. Subsequently, the process flow repeats back to operation 106 to use the temperature sensing device 231 to sense a temperature inside the inner tube 12 again.

The method 612 in FIG. 23 is similar to the method 512 in FIG. 21 except that method 512 maintains the pressure inside the outer tube 11 by adjusting the pressure inside the outer tube 11 base on the temperature inside the outer tube 11. Whereas the method 612 maintains the pressure inside the outer tube 11 by adjusting the pressure inside the outer tube 11 base on the temperature inside the inner tube 12. The method 612 maintains the pressure in the outer tube 11 by decreasing the pressure in the outer tube 11 when the temperature in the inner tube 12 is outside of the suitable temperature range inside the inner tube 12.

Figure 24:
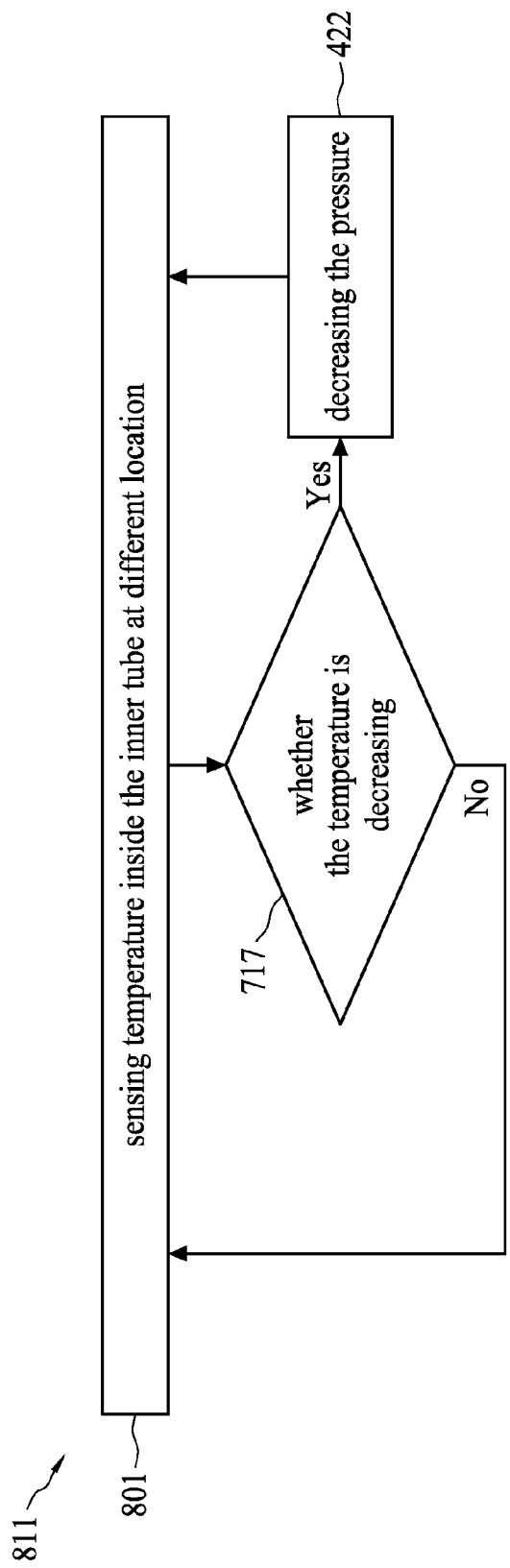

In FIG. 24, a method 811 is illustrated. FIG. 24 illustrates a process flow for dissipating process exhaust 70 as illustrated in FIG. 3 and FIG. 8. In operation 801, temperature inside the inner tube 12 is sensed at different location. Temperature inside the inner tube 12 at different location is associated with a transferring of heat of the exhausts 70 along the inner tube 12. Temperature varies inside the inner tube 12 from near the chamber 41 at one end to near the terminal 25 at another end. A variation of temperature inside the inner tube 12 is associated with a dissipation of heat from the exhausts 70 as exhausts 70 travel along the inner tube 12. To determine whether exhaust 70 changes from gas phase to another phase along a path 72 in the inner tube 12, heat dissipation from one end to another end is detected. In some embodiments, to detect the heat dissipation is by sensing temperature at different location. A difference in the temperature variation is associated with how much heat is dissipated at different location in the inner tube 12. In some embodiments, a temperature sensing device 231 senses first temperature at one end of the inner tube 12 close to the chamber 41. A temperature sensing device 232 senses second temperature at another end of the inner tube 12 close to the terminal 25. In FIG. 24, some exemplary embodiments for operation 801, operation 717, and operation 422 are illustrated in FIG. 8, FIG. 2 and FIG. 3.

Operation 801 senses temperature inside the inner tube 12 at different location. In some embodiments, multiple locations are sensed. For example, one location is near the chamber 41, one is near the terminal 25 and some others are in between. Operation 717 determines whether the temperature along the inner tube 12 is decreasing from one location to another. For example, temperature near terminal 25 is lower than temperature near the chamber 41 by a temperature difference. Upon determining the temperature inside the inner tube 12 is decreasing from one location to another by a temperature difference greater than a predetermined temperature decreasing difference, the pressure inside the outer tube 11 is decreased in operation 422. In some embodiments, the temperature difference is compare to the predetermined temperature decreasing difference. In some embodiments, when the temperature inside the inner tube 12 is decreasing from one location to another, a contaminating particle is formed inside the inner tube 12. To prevent the contamination inside inner tube 12, pressure inside the outer tube 11 is decreased in operation 422. The process flow repeats back to operation 801 to sense temperature inside the inner tube 12 at different location.

Upon determining the temperature is not decreasing from one location to another in operation 717, the process flow loops back to operation 801 to sense temperature inside the inner tube 12 again. In some embodiments, computer 31 is used to compare the temperature difference with the predetermined temperature decreasing difference. The method 811 maintains the pressure in the outer tube 11 by decreasing the pressure in the outer tube 11 when the temperature difference in the inner tube 12 is outside of the predetermined temperature decreasing difference.

Figure 25:
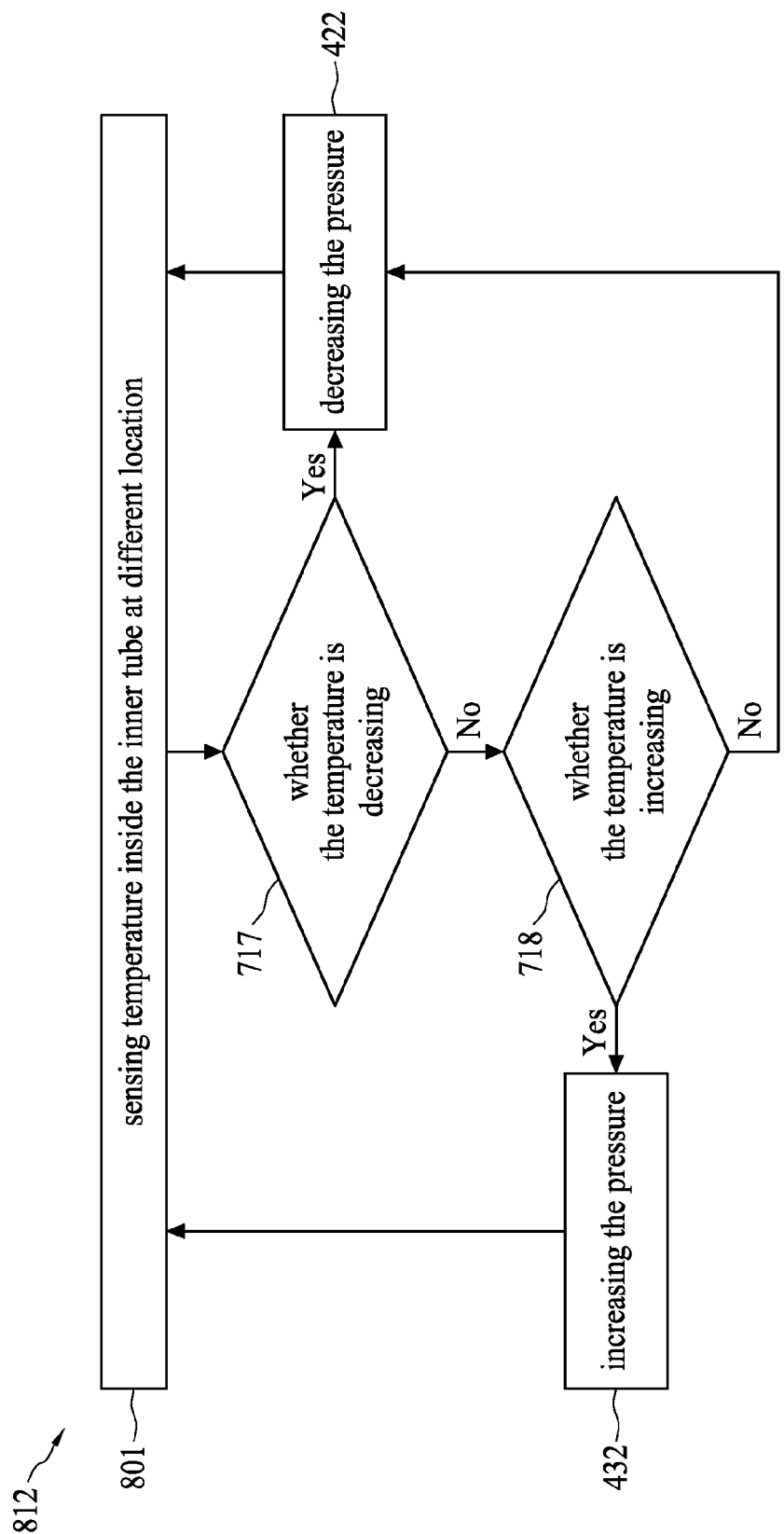

In FIG. 25, a method 812 includes additional operation 718 and operation 432. In FIG. 25, some exemplary embodiments for operation 801, operation 717, operation 422, operation 718, and operation 432 are illustrated in FIG. 8 and FIG. 3.

Upon determining the temperature is not decreasing in operation 717, whether the temperature is increasing beyond a predetermined temperature increasing difference is determined in operation 718. In some embodiments, determining whether the temperature is increasing is by comparing temperature at various locations in the inner tube 12. For example, the exhaust 70 has the first temperature while exiting the chamber 41 and a second temperature while exiting the pipeline 10 near the terminal 25. The second temperature is negative offset from the first temperature within a predetermined value. The negative offset is the temperature difference. To prevent or reduce the negative offset, the pressure in the outer tube 11 is increased by decreasing a pumping rate of the pump 21 in operation 432. Subsequently, the process flow repeats back to operation 801 to sense temperature inside the inner tube 12 at different location again.

Upon determining the temperature is not increasing from an exhaust outlet 251 to the terminal 25 along the inner tube 12 in operation 718, the pressure is decreased in operation 422. Subsequently, the process flow repeats back to operation 801 to use the temperature sensing device 231 and 232 to sense a temperature inside the inner tube 12 at different location again. The method 812 maintains the pressure in the outer tube 11 by decreasing the pressure in the outer tube 11 when a temperature difference in the inner tube 12 is outside of the predetermined temperature increasing difference.

Figure 26:
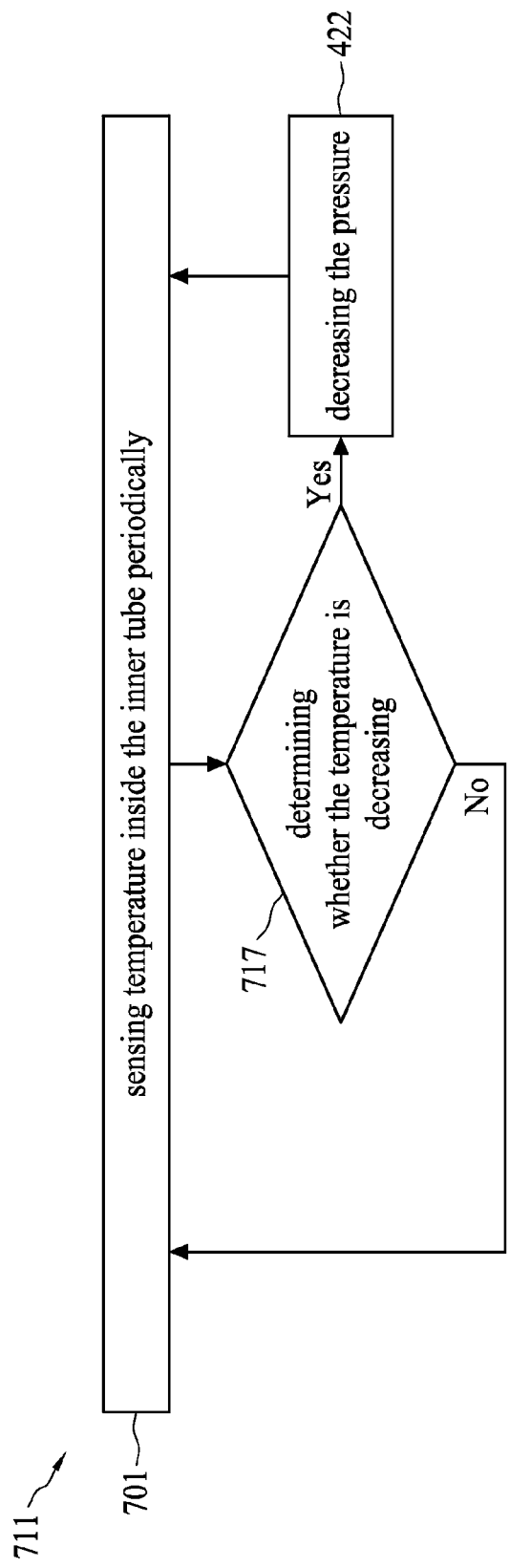

In FIG. 26, a method of operating 701 is illustrated. FIG. 26 illustrates a process flow for dissipating process exhaust 70 as illustrated in FIG. 3 and FIG. 8. In operation 701, temperature inside the inner tube 12 is sensed periodically. Temperature inside the inner tube 12 at different period is associated with a rate of heat transferred in the inner tube 12. In some embodiments, temperature variation inside the inner tube 12 from one period to another period is dependent on an amount of exhaust 70 passing down the inner tube 12. In some embodiments, temperature variation inside the inner tube 12 from one period to another period is associated with heat dissipation from inner tube 12 to outer tube 11. To determine whether exhaust 70 changes from gas phase to another during a period, a temperature variation in the period is to be detected. Temperature variation is associated with how fast heat is dissipating from one period to another period. In some embodiments, a temperature sensing device 231 senses temperature periodically at the same location. In FIG. 26, some exemplary embodiments for operation 701, operation 717, and operation 422 are illustrated in FIG. 8 and FIG. 3.

Operation 701 senses temperature inside the inner tube 12 periodically. In some embodiments, different period are set with different duration. Operation 717 determines whether the temperature is decreasing from one period to another. For example, temperature at first period is lower than temperature at second period by a temperature difference. A rate of decreasing is determined. Upon determining the temperature inside the inner tube 12 is decreasing from one period to another by a decreasing rate in operation 717, the pressure inside the outer tube 11 is decreased in operation 422. In some embodiments, the decreasing rate is compared with a predetermined decreasing rate limit. For example, when the temperature inside the inner tube 12 is decreasing faster than a certain rate, dust particle starts to form inside the inner tube 12. To prevent the contamination by the forming of particles inside inner tube 12, the temperature decreasing rate is reduce by decreasing pressure inside the outer tube 11 in operation 422. Subsequently, the process flow repeats back to operation 701 to sense temperature inside the inner tube 12 periodically.

Upon determining the temperature is not decreasing faster than the predetermined decreasing rate limit in operation 717, the process flow loops back to operation 701 to sense a temperature inside the inner tube 12 periodically again. The method 711 maintains the pressure in the outer tube 11 by decreasing the pressure in the outer tube 11 when a decreasing rate of temperature variation in the inner tube 12 is faster than the predetermined decreasing rate limit.

Figure 27:
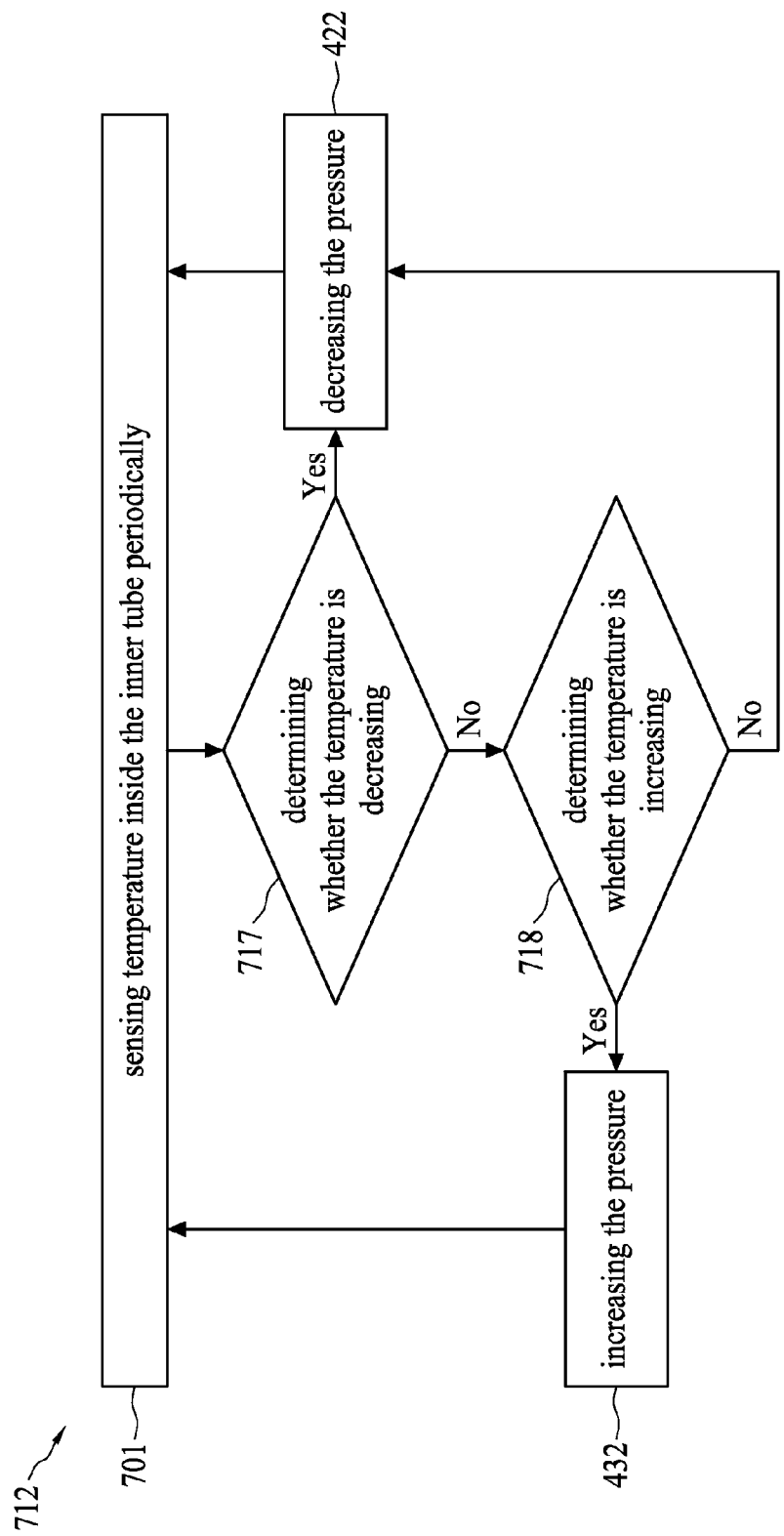

In FIG. 27, a method 712 includes additional operation 718 and operation 432. Method 712 monitors a temperature variation in the inner portion. In FIG. 27, some exemplary embodiments for operation 701, operation 717, operation 422, operation 718, and operation 432 are illustrated in FIG. 8 and FIG. 3.

Upon determining the temperature is not decreasing periodically in operation 717, whether the temperature is increasing is determined in operation 718. In some embodiments, an increasing rate of the temperature in the inner tube 12 is compared with a predetermined increasing rate limit. In some embodiments, determining whether the temperature is increasing is by comparing temperature at different periods at a same location in the inner tube 12. For example, at a starting of a conveying process, the exhaust 70 comes out of chamber 41. As a first portion of the exhaust 70 passing through the pipeline 10, temperature near the exhaust outlet 251 is increasing from a first period to a second period. Upon detecting the increasing temperature in operation 718, the pressure in the outer tube 11 is increased by decreasing the pressure in the outer tube 11 in operation 432. Subsequently, the process flow repeats back to operation 701 to sense temperature inside the inner tube 12 periodically again.

Upon determining the temperature is not increasing periodically, the pressure in the outer tube 11 is decreased in operation 422. Subsequently, the process flow repeats back to operation 701 to sense a temperature inside the inner tube 12 periodically. The method 712 maintains the pressure in the outer tube 11 by decreasing the pressure in the outer tube 11 when a rate of temperature variation in the inner tube 12 is faster or slower than a predetermined rate limit. The predetermined rate limit includes the predetermined increasing rate limit or the predetermined decreasing rate limit.

In some various embodiments, different methods of maintaining the pressure in the outer tube 11 are configured base on different combinations of methods in the present disclosure. For example, maintaining the pressure in the outer tube 11 by decreasing or increasing the pressure in the outer tube 11 base on sensing different conditions in the pipeline 10. Different conditions include temperature or pressure in the inner tube 12 or in the outer tube 11. Different sensing methods include sensing periodically or continuously, and/or sensing at one location or at plurality of locations along the pipeline 10.

Some embodiments of the present disclosure provide a method of dissipating process exhaust from a chamber. The method includes conveying the process exhaust from the chamber through an inner tube of a pipeline to abatement. The process exhaust has a first temperature while exiting the chamber, and a second temperature while exiting the pipeline. The method maintains an outer tube of the pipeline at a vacuum state by a pump such that the inner tube is substantially thermal isolated from the atmosphere outside the pipeline. The second temperature is negative offset from the first temperature within a predetermined value.

Some embodiments of the present disclosure provide a method of dissipating process exhaust from a chamber. The method includes extracting the process exhaust from the chamber through a vacuum pump. A pipeline is disposed between the chamber and the vacuum pump. The method configures the pipeline into at least two different portions comprising an inner portion provided as a path of the process exhaust and an outer portion maintained at a vacuum state. The outer portion thermally isolates the inner portion from the atmosphere around the pipeline. The method keeps temperature inside the inner portion above a predetermined value such that the process exhaust stays in gas phase throughout the path.

Some embodiments of the present disclosure provide a system for exhaust dissipation. The system includes a pipeline configured to connect to an exhaust outlet of a chamber at one end. The pipeline includes a multi-layer structure. The multi-layer structure includes an inner portion configured for the exhaust to pass through; and an outer portion surrounded the inner portion and configured to provide a thermal insulation for the inner portion. A pump couples to the outer portion and configured to maintain a vacuum state inside the outer portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of dissipating process exhaust from a chamber, the method comprising:
    conveying the process exhaust from the chamber through an inner tube of a pipeline to an abatement, wherein the process exhaust has a first temperature while exiting the chamber, and a second temperature while exiting the pipeline; and
    maintaining an outer tube of the pipeline at a vacuum state by a pump such that the inner tube is substantially thermal isolated from the atmosphere outside the pipeline,
    wherein the second temperature is negative offset from the first temperature within a predetermined value.

2. The method of claim 1, further comprising sensing the first temperature or the second temperature.

3. The method of claim 1, further comprising keeping pressure inside the outer tube below a predetermined pressure range.

4. The method of claim 1, further comprising sensing a pressure inside the outer tube.

5. The method of claim 1, further comprising sensing a temperature in the outer tube.

6. The method of claim 1, further comprising preventing a direction of flow from entering into the outer tube.

7. A method of dissipating process exhaust from a chamber, the method comprising:
    extracting the process exhaust from the chamber through a vacuum pump, wherein a pipeline is disposed between the chamber and the vacuum pump;
    configuring the pipeline into at least two different portions comprising an inner portion provided as a path of the process exhaust and an outer portion maintained at a vacuum state, wherein the outer portion thermally isolates the inner portion from the atmosphere around the pipeline; and
    keeping temperature inside the inner portion above a predetermined value such that the process exhaust stays in gas phase throughout the path.

8. The method of claim 7, further comprising sensing temperature inside the inner portion.

9. The method of claim 7, further comprising sensing temperature inside the outer portion.

10. The method of claim 7, further comprising sensing pressure inside the outer portion.

11. The method of claim 7, further comprising maintaining pressure inside the outer portion within a predetermined pressure range.

12. The method of claim 7, further comprising monitoring pressure and temperature in the pipeline.

13. The method of claim 7, further comprising monitoring a temperature variation in the inner portion.

14. The method of claim 7, further comprising preventing a direction of flow from entering into the outer portion of the pipeline.

15. A system for exhaust dissipation, comprising:
a pipeline configured to connect to an exhaust outlet of a chamber at one end, comprising:
   a multi-layer structure comprising:
      an inner portion configured for the exhaust to pass through; and
      an outer portion surrounded the inner portion and configured to provide a thermal insulation for the inner portion;
a pump coupled to the outer portion and configured to maintain a vacuum state inside the outer portion.

16. The system of claim 15, wherein the pump is coupled to the other end of the pipeline and configured to extract exhaust from the chamber.

17. The system of claim 15, further comprising an invert valve coupled to the outer portion.

18. The system of claim 15, further comprising a vacuum gauge coupled to the outer portion.

19. The system of claim 15, further comprising a thermometer coupled to the inner portion.

20. The system of claim 15, wherein an inner wall of the outer portion is configured to be a radiation reflective surface.

* * * * *